| (12) | United States Patent | (10) Patent No.: | US 8,288,968 B2 |
|---|---|---|---|
| | Van Endert et al. | (45) Date of Patent: | Oct. 16, 2012 |

(54) LIGHTING SYSTEM ARRANGED WITH MULTIPLE LIGHT UNITS WHERE EACH OF ADJACENT LIGHT UNITS HAVING LIGHT BEAMS OVERLAP EACH OTHER

(75) Inventors: Tony Petrus Van Endert, Taipei (TW); Tzu-Nan Chen, Taipei (TW)

(73) Assignee: Lite-On It Corporation, Taipei (TW)

( * ) Notice: Subject to any disclaimer, the term of this patent is extended or adjusted under 35 U.S.C. 154(b) by 319 days.

(21) Appl. No.: 12/742,017

(22) PCT Filed: Nov. 8, 2007

(86) PCT No.: PCT/CN2007/003167
§ 371 (c)(1),
(2), (4) Date: May 7, 2010

(87) PCT Pub. No.: WO2009/059465
PCT Pub. Date: May 14, 2009

(65) Prior Publication Data
US 2010/0264833 A1 Oct. 21, 2010

(51) Int. Cl.
*H05B 37/02* (2006.01)
(52) U.S. Cl. .............. 315/360; 362/249.02; 362/249.06; 398/182; 398/202
(58) Field of Classification Search .................. 315/291, 315/360; 362/227, 249.02, 249.06, 249.14, 362/362; 398/140, 172, 182, 202
See application file for complete search history.

(56) References Cited

U.S. PATENT DOCUMENTS 6,424,442 B1 * 7/2002 Gfeller et al. ................. 398/135
6,606,175 B1 * 8/2003 Sampsell et al. .............. 398/140

FOREIGN PATENT DOCUMENTS

| CN | 1874640 A | 12/2006 |
|---|---|---|
| JP | 8286287 A | 11/1996 |
| JP | 2002190398 A | 7/2002 |
| JP | 2007265702 A | 10/2007 |

OTHER PUBLICATIONS

International Search Report and Written Opinion dated Jul. 23, 2008.

* cited by examiner

*Primary Examiner* — Thuy Vinh Tran
(74) *Attorney, Agent, or Firm* — Thomas, Kayden, Horstemeyer & Risley, LLP

(57) ABSTRACT

A lighting system comprising a plurality of light units, wherein said light units are arranged in an array, wherein the light beams of substantially each pair of adjacent light units overlap each other, and wherein the light system comprises a light control device which is arranged to adjust the intensity of each one of said plurality of light units individually, wherein said light control device is further arranged to maintain the total combined luminous flux emitted from said plurality of light units on a predefined imaginary flat surface substantially equal when adjusting the intensity of the individual light units.

10 Claims, 34 Drawing Sheets

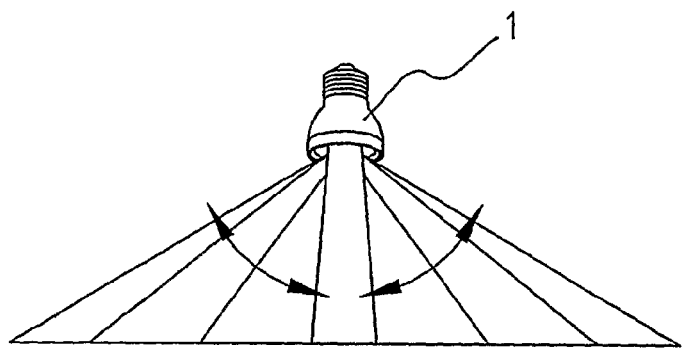
FIG. 21A
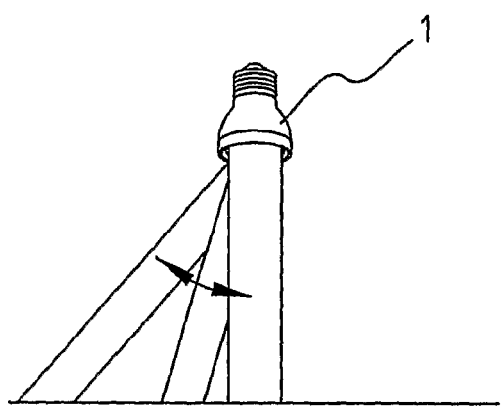 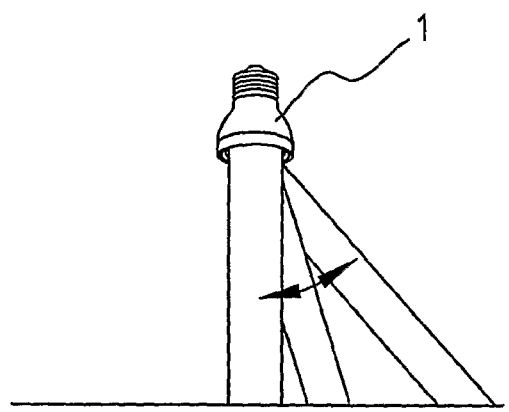
FIG. 21B  FIG. 21C

LIGHTING SYSTEM ARRANGED WITH MULTIPLE LIGHT UNITS WHERE EACH OF ADJACENT LIGHT UNITS HAVING LIGHT BEAMS OVERLAP EACH OTHER

CROSS REFERENCE TO RELATED APPLICATION

This application is the 35 U.S.C. §371 national stage of PCT application PCT/CN2007/003167, filed Nov. 8, 2007, the disclosure of which is hereby incorporated by reference.

FIELD OF THE INVENTION

The invention relates to a lighting system comprising a lamp arranged to transform electricity into a light beam having properties such as intensity, colour, colour temperature, direction and beam cone angle, and a light control means arranged to adjust said light beam properties.

BACKGROUND OF THE INVENTION

In existing lighting applications often a very wide illumination of the whole room is performed. But in many cases only a small part of the room needs to be illuminated, which is not energy efficient. Furthermore, in existing light applications light beam focussing and light beam position deviation is achieved in a mechanical way, which is not flexible and is vulnerable to mechanical failures.

It is a goal of the invention to provide a more robust, energy efficient, easy to use and/or flexible lighting system.

Adjustment of a lamp's properties is well known to be achieved via a remote control (RC). A disadvantage of a remote control is the necessity of the presence of the remote control on the right location at a random moment. Also a lot of different remote controls are already present in the living room for TV, audio, VCR, CD/DVD player/recorder, etc. Further, the different buttons on a remote control can be confusing to the user. Finally, the costs of a remote control and the accompanying receiver are relatively high.

Also control of electrical devices by the use of video cameras and movement detection software is known, wherein the user can control the electrical device by making gestures in front of the camera. Such systems require heavy duty processing power, have a relatively long response time, and are relatively expensive.

WO 2006/056814 describes a lighting system comprising a lamp and a control means comprising an infrared transmitter, an infrared receiver and a lens arrangement. The control means measure the intensity of the reflected infrared light, and changes the lamp brightness in reaction thereto. In this manner the lamp can be switched on and off, and can be dimmed by hand movements in the infrared beam. Such an arrangement is however relatively expensive and inaccurate, as the intensity of the reflected infrared signal heavily depends on the kind of object that is moved in the beam.

It is therefore a further goal of the invention to provide an improved, cheap, reliable and/or easy-to-use control system for lighting. A further goal of the invention is to provide a lighting system that is safe and comfortable for its users and their environment.

SUMMARY OF THE INVENTION

According to one aspect of the invention a lighting system comprises a plurality of light units, wherein said light units are arranged in at least two groups forming concentric polygons or circles, wherein the light beams of substantially each pair of adjacent light units overlap each other, wherein the light beams of the inner group are directed substantially parallel to each other, wherein the light beams of the light units in the outer group diverge from the light beams of the light units in the inner group, and wherein the light system comprises a light control means which is arranged to adjust the intensity of each one of said plurality of light units individually.

With the invention two effects can be achieved without physically moving the lighting system: the direction of the combined light beam of the light units can be changed, and the angle of the combined light beam can be changed. Also combinations of these two effects, as well as these effects in multiple combined light beams in one lighting system (i.e. in one lamp) can be achieved.

According to another aspect of the invention the lighting system comprises a plurality of light units, wherein said light units are arranged in an array, wherein the light beams of substantially each pair of adjacent light units overlap each other, and wherein the light system comprises a light control means which is arranged to adjust the intensity of each one of said plurality of light units individually, wherein said light control means is further arranged to maintain the total combined luminous flux emitted from said plurality of light units on a predefined imaginary flat surface substantially equal when adjusting the intensity of the individual light units.

Said light control means is preferably arranged to adjust the intensity of the individual light units by dimming and/or brightening such that the diameter of the combined light beam of the light units that are switched on increases or decreases smoothly. Thus, preferably the light units are not switched on and off suddenly.

Likewise, said light control means is furthermore preferably arranged to adjust the intensity of the individual light units by dimming and brightening such that the direction of the combined light beam of the light units that are switched on moves smoothly from a first direction to a second direction.

In the preferred embodiments of the aforementioned two aspects of the invention said light units are LEDs.

In the preferred embodiments the lighting system furthermore comprises a lens extending in the light beam of the light units of said inner group for focussing said light beam.

Furthermore in the preferred embodiments the lighting system comprises at least one middle group of light units extending in a concentric polygon or circle between the inner and outer groups. The light beams of said middle group are preferably directed substantially parallel to the light beams of said inner group.

In the preferred embodiments said plurality of light units are contained in one lamp housing, preferably comprising a standard lamp fitting.

The lighting system further preferably comprises at least one ultrasonic transmitter for adjusting the light intensity of said individual light units by using time-of-flight measurements in the Z-direction (being the lamp axis), as described herein, and/or by using one of the proposals for gesture control in the XY-plane (being the plane perpendicular to the lamp axis) as described herein. In particular gesture control in the XY-plane is well suited for control of the light beam direction and/or angle of the lighting system.

In a preferred embodiment the lighting system further comprises a plurality of ultrasonic transmitters arranged to transmit ultrasonic signals; a plurality of ultrasonic receivers arranged to receive reflected ultrasonic signals; and a processing means arranged to send an ultrasonic pulse sequentially through each of said transmitters and to determine after each pulse is sent which ones of said receivers receive a reflected ultrasonic signal with an amplitude exceeding a predetermined threshold within a predetermined period, and to send control signals to said light control means in dependence of said determination. Preferably said ultrasonic transmitters are arranged such that the ultrasonic signals are transmitted within and parallel to the light beam of the lamp. Said ultrasonic transmitters and receivers are preferably arranged in an equilateral polygon or a circle. In the preferred embodiment said system comprises three of said transmitters and three of said receivers.

In another preferred embodiment the lighting system further comprises an ultrasonic transmitter arranged to transmit ultrasonic signals; an ultrasonic receiver arranged to receive reflected ultrasonic signals; wherein said ultrasonic transmitter and/or receiver are mounted on a rotatable carrier such that the beam of said transmitter and/or the reception cone of said receiver extend parallel to and at a distance from the axis of rotation, wherein driving means are present to rotate said carrier; and a processing means arranged to send an ultrasonic pulse repeatedly through said transmitter during rotation at a multitude of angular positions of said carrier and to determine after each pulse is sent if said receiver receives a reflected ultrasonic signal with an amplitude exceeding a predetermined threshold within a predetermined period, and to send control signals to said light control means in dependence of said determination. Preferably the axis of rotation of said rotatable carrier extends within, and parallel to, the light beam of the lamp. Said processing means is preferably arranged to send an ultrasonic pulse at least 3, preferably at least 6, more preferably at least 12 angular positions of said carrier.

The processing means is in the preferred embodiments of both aforementioned aspects of the invention further arranged to derive a time-of-flight signal representing the time differences between said transmitted and received ultrasonic signals and to send control signals to said light control means in dependence of said time-of-flight signal, as will be further explained below. This control mechanism provides a high resolution control, and is for instance very suitable for controlling light intensity, colour and/or colour temperature.

In yet another preferred embodiment the lighting system further comprises at least one ultrasonic transmitter arranged to transmit ultrasonic signals; a plurality of spaced apart ultrasonic receivers arranged to receive reflected ultrasonic signals; and a processing means arranged to determine for each of said receivers time-of-flight signals representing the time differences between said transmitted signals from said at least one transmitter and the associated received reflected ultrasonic signals from said receiver, and to send control signals to said light control means in dependence of the combination of said time-of-flight signals for each of said receivers. Preferably said combination of said time-of-flight signals for each of said receivers is a function of said time-of-flight signals defining the location of an object reflecting said ultrasonic signals in a two-dimensional plane or a three-dimensional space within the beams of said transmitters and receivers.

All of the above-mentioned aspects of the invention provide, in a very efficient, cheap and reliable manner, the possibility to control the light system by hand gestures in directions substantially perpendicular to the axis of the ultrasound beam(s). If a reflecting object (such as a hand) is present in the beam, the position of the object in said directions can continuously be determined, and control of the various properties of the lighting system can be achieved thereby.

This control mechanism is suited for switching purposes, for instance for switching from controlling one light property to another light property. The processing means is therefore in the preferred embodiments of all three aforementioned aspects of the invention further arranged to select in dependence of said determination a type of control signals from a plurality of types of control signals, wherein each type of control signals controls a different one of said light properties.

Another suitable, intuitive purpose of this mechanism is control of the width of the light beam angle or of the light beam direction. A user can move a hand in the beam in a perpendicular direction in order to move the direction of the light beam or in order to widen or narrow the light beam.

Said processing means is preferably arranged to analyse the dynamic behaviour of said time-of-flight signals and to send control signals to said light control means in dependence of said dynamic behaviour.

Said transmitter and receiver are in the aforementioned aspects of the invention preferably a combined transceiver, and preferably said transceiver is provided with a sound horn for narrowing the angle of the sent ultrasonic waves and narrowing the angle of receipt of reflected signals.

In the preferred embodiments the lighting system comprises an ultrasonic transmitter arranged to transmit ultrasonic signals, an ultrasonic receiver arranged to receive reflected ultrasonic signals, and a processing means arranged to derive a time-of-flight signal representing the time differences between said transmitted and received ultrasonic signals and to send control signals, for instance binary code, to said light control means in dependence of said time-of-flight signal. Thereby a user of the system can adjust the lamp properties by moving an object, such as his hand, in the direction of the axis of the ultrasonic beam.

The ultrasonic transmitters may for instance emit sound at a frequency of 40 kHz. Although alternatives to the use of ultrasonic transmitters/receivers, such as for instance infrared or radar transmitters/receivers would be capable of measuring the time-of-flight of the respective signals, ultrasound is in particular suitable for the present application, since the time-of-flight (where the typical distance is between 0.2 and 2 meter) can be measured in milliseconds rather than in nanoseconds, which allows for easy and accurate measurement with low cost processing equipment. The system of the invention can be produced at very low cost, since piezoelectric acoustic transceivers are very cheap.

The system of the invention is easy to control, with a simple user interface which does not require additional equipment such as a remote control. Other qualities of the system of the invention are its robustness, its independency from environmental conditions, its one-dimensional recognition of control movements, and its low processing power requirements. The further advantage of an ultrasound sensor is that it is less influenced by changing ambient light, temperature and humidity conditions.

Said ultrasonic transmitter and receiver, processing means, and/or light control means, preferably extend in the lamp housing, and said ultrasonic transmitter and receiver preferably are a combined ultrasonic transceiver. Thereby a compact and easy to install lighting system is provided, that is intuitively controlled by moving one's hand in the centre of the light beam. The invention also relates to a single lamp unit comprising the entire lighting system as described above.

It is desirable that the ultrasound controlled lighting system is easy to produce in mass quantities, with low cost components, and has small dimensions so that it can be built-in in even in a small lamp.

In a preferred embodiment the lighting system in accordance with the invention comprises a LED driver and a pulse width modulator arranged to adjust said light beam properties; a DA-converter, an ultrasound driver and an ultrasonic transmitter arranged to convert a digital transmit signal into the transmission of an ultrasonic pulse; an ultrasonic receiver and an amplifier arranged to receive reflected ultrasonic signals and transform said ultrasonic signal in a voltage, and a comparator arranged to generate a digital receive signal if said voltage is greater than a predetermined threshold; a processing means arranged to derive a time-of-flight signal representing the time differences between said digital transmit and receive signals and to send control signals to said light control means in dependence of said time-of-flight signal. Preferably said processing means, said pulse width modulator, said DA-converter and said comparator are integrated in a single microcontroller chip. Said microcontroller chip is preferably chosen from the single-chip 8-bit 8051/80C51 microcontroller family, preferably comprising small sized RAM and ROM, preferably smaller than 4 kB ROM and smaller than 512 B RAM.

Preferably said ultrasonic transmitter and said ultrasonic receiver are integrated in a piezoelectric ultrasound transceiver.

Preferably said transmitting ultrasound driver and said receiving ultrasound amplifier are integrated in a pre-processing circuit. Said pre-processing circuit preferably further comprises a second order filter for filtering out low frequent signals from said received signal.

BRIEF DESCRIPTION OF THE DRAWINGS

The invention will be further explained by means of a preferred embodiment as shown in the accompanying drawings, wherein:

FIGS. 21A and 21B/C schematically show the focussing and deviation respectively of a light beam of a LED array lamp;

DETAILED DESCRIPTION OF THE PREFERRED EMBODIMENTS

Figure 2:
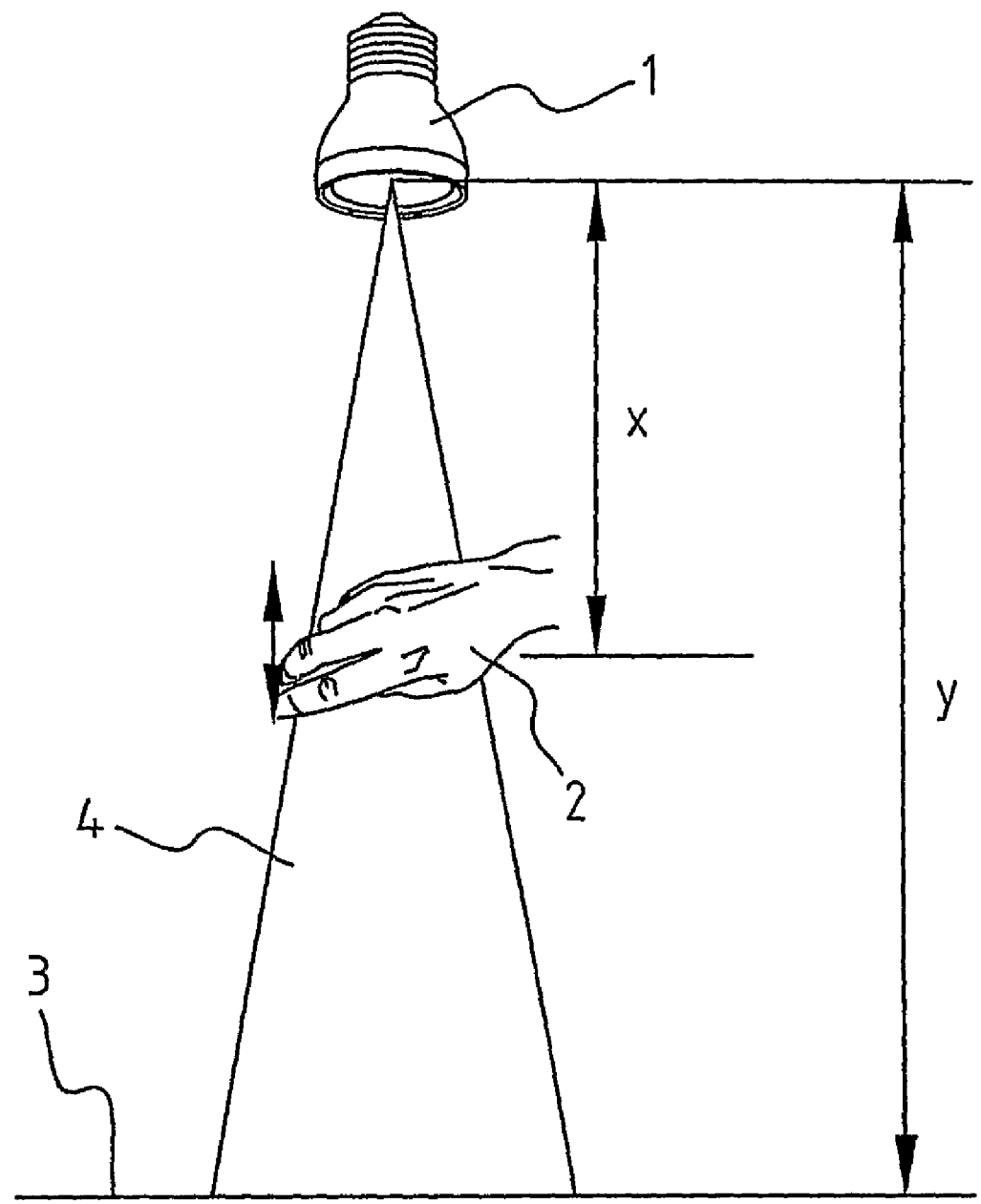
FIG. 2 is a schematic perspective view of a lamp and its control mechanism.

The lamp 1 as shown in FIG. 2 comprises a plurality of LEDs and an ultrasonic transceiver built-in in the centre of said plurality of LEDs. Also a processing means for translating the signals of the transceiver into control signals, and control means to adjust the light properties are built-in.

If the ultrasonic transceiver is switched on it will send an acoustic signal. If an object is present the acoustic signal will be reflected at the object and will be received by the ultrasonic transceiver inside the lamp. The time difference, called the time-of-flight, between sending and receiving the acoustic signal will be measured. If the distance between the object and the lamp 1 is changed another time-of-flight value will be measured. The detected movement of the object is a one-dimensional movement (the object must stay in the ultrasound beam cone). The change in time-of-flight will be translated into a change in a digital control signal. This control signal will control the properties of the light beam, like colour, intensity or colour temperature, etc.

The object may be the hand 2 of a user. Thus a one-dimensional movement of the hand 2, like up/down or left/right direction (depending on lamp position, horizontal or vertical) can control the light beam properties.

In commercially available pulse echo distance measurement units of the transmitter-reflector-receiver type (TRR), the most common task is to measure the distance to the closest reflecting object. The measured time is the representative of travelling twice the distance. The returned signal follows essentially the same path back to a receiver located close to the transmitter. Transmitting and receiving transceivers are located in the same device. The receiver amplifier sends these reflected signals (echoes) to the micro-controller which times them to determine how far away the object is, by using the speed of sound in air.

Figure 1:
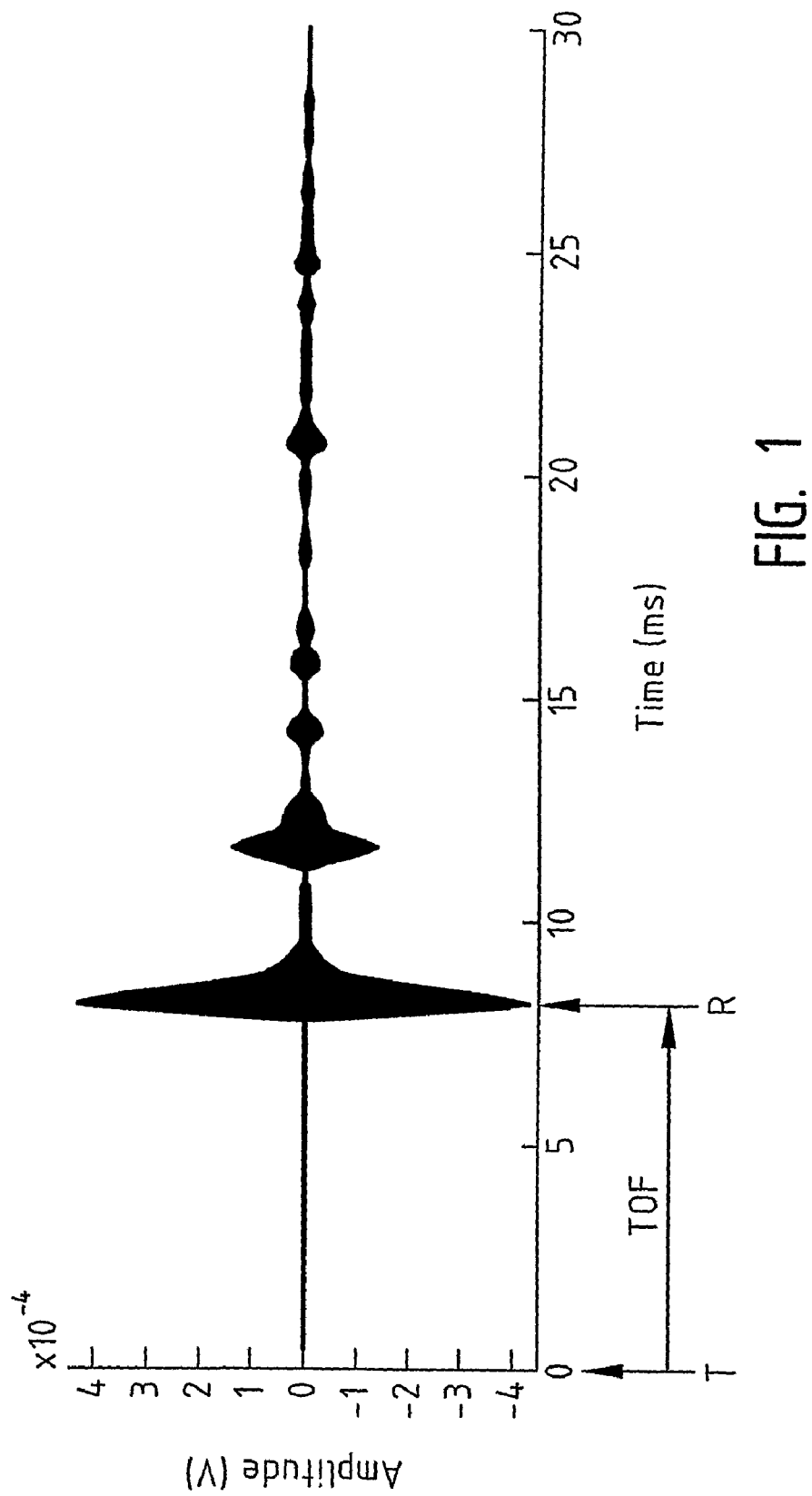
FIG. 1 is a graph showing the principle of time-of-flight measurement with an ultrasonic transceiver.

The time-of-flight of acoustic signals is commonly used as a distance measurement method. A time-of-flight measurement, as illustrated in FIG. 1 is formed by subtracting the time-of-transmission (T in FIG. 1) of a signal from the measured time-of-receipt (R in FIG. 1). This time distance information will be transferred into a binary code in the microprocessor to control the lamp properties.

In FIG. 2 a hand 2 is the obstacle/object and a table 3, floor or ceiling is the reference. The ultrasonic transceiver sends an ultrasonic wave in the form of a beam cone 4. If the distance y from the transceiver to the reference is 1.5 m, the total travel distance for the ultra-sound beam 4 is 2*y=3 m. The time-offlight then is 8.7 ms (at an ambient temperature of 25° C.). If the distance x from the transceiver to the hand is 0.5 m, the time-of-flight is 2.9 ms. If the required accuracy of control steps of the hand movement is 2 cm (time-of-flight steps of 0.12 ms), and the range of control is for instance 64 cm, there are 32 control steps, which allows for 5-bit control.

Figure 3:
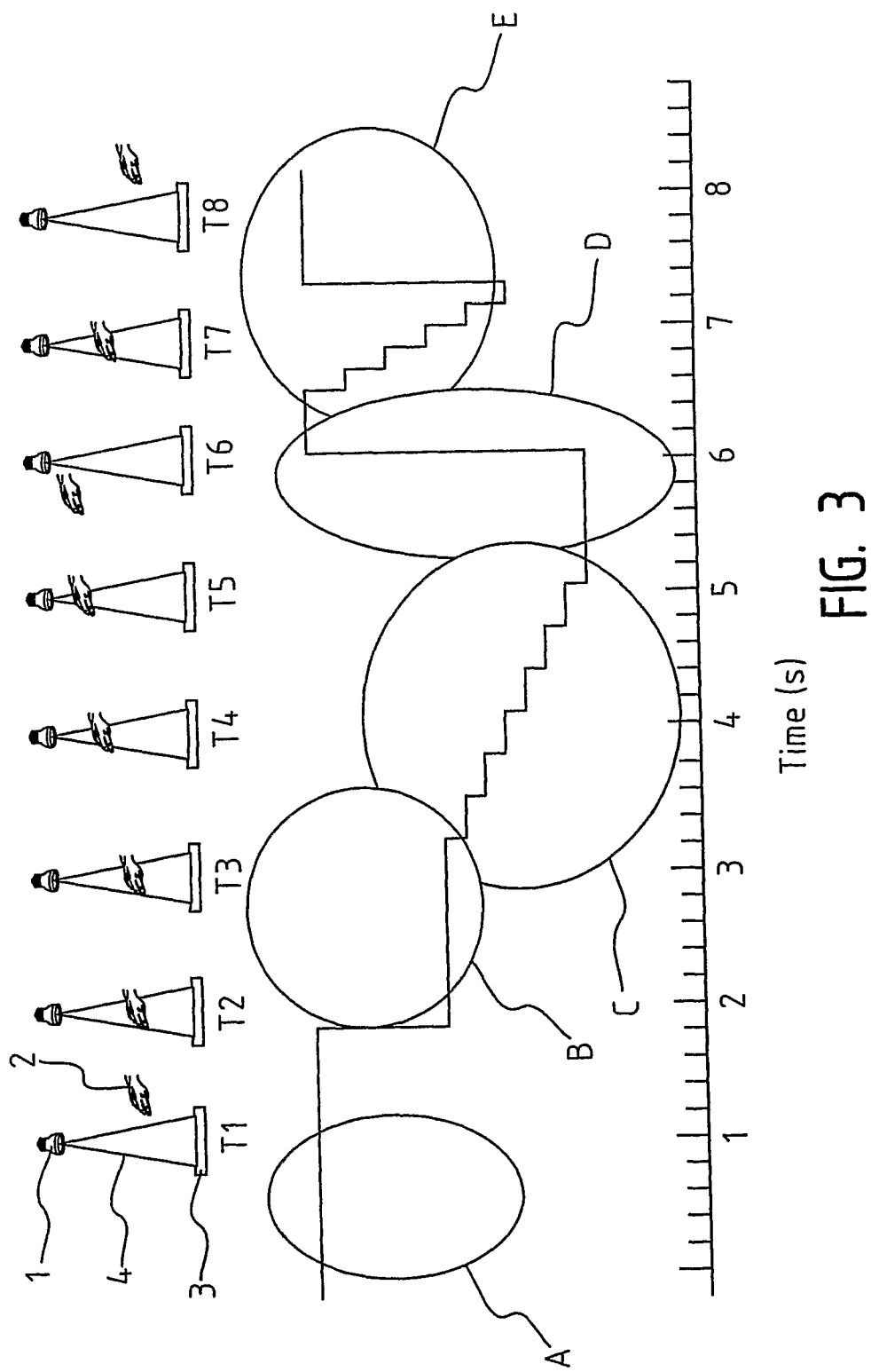
FIG. 3 is a combined drawing showing stills of hand movements in the system of FIG. 2 and a graph showing the time-of-flight signal against time, and various stages of lamp property control caused by said hand movements.

The control signal as shown in FIG. 3 is made by the movement of the hand 2 in a one-dimensional vertical direction in the ultrasonic beam 4. At T1=1 s the hand 2 is outside the beam, the reference value is measured, and lamp control is disabled (stage A). At T2=2 s the hand 2 moves into the beam 4 and is held there for more than 1 second until at T3=3 s lamp control is enabled by the microcontroller (stage B). Then the hand 2 moves up between T3=3 s and T5=5 s, whereby for instance the intensity of the lamp 1 is increased by the microprocessor (stage C). At T6=6 s the hand is withdrawn from the beam 4 so that the reference value is measured, and lamp control is disabled thereby (stage D). An accidental movement of the hand 2 in the ultrasonic beam 4 as shown at T7=7 s does therefore not result in an accidental adjustment of the lamp properties (stage E). Hence, the lamp control is activated by holding an object in the ultrasonic beam 4 for more than 1 second.

Figure 4:
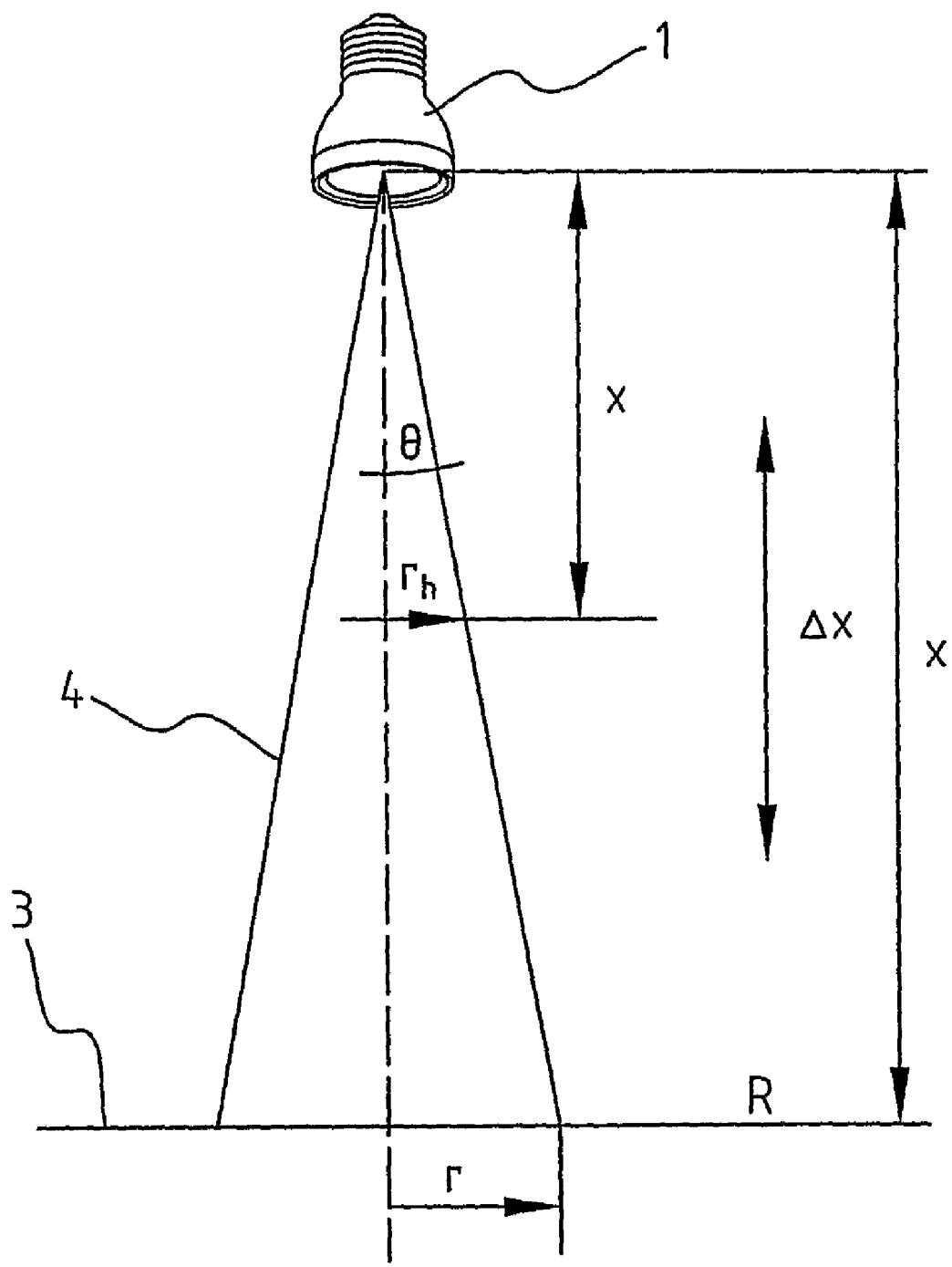
FIG. 4 is a schematic perspective view of the lamp of FIG. 2.
Figure 5:
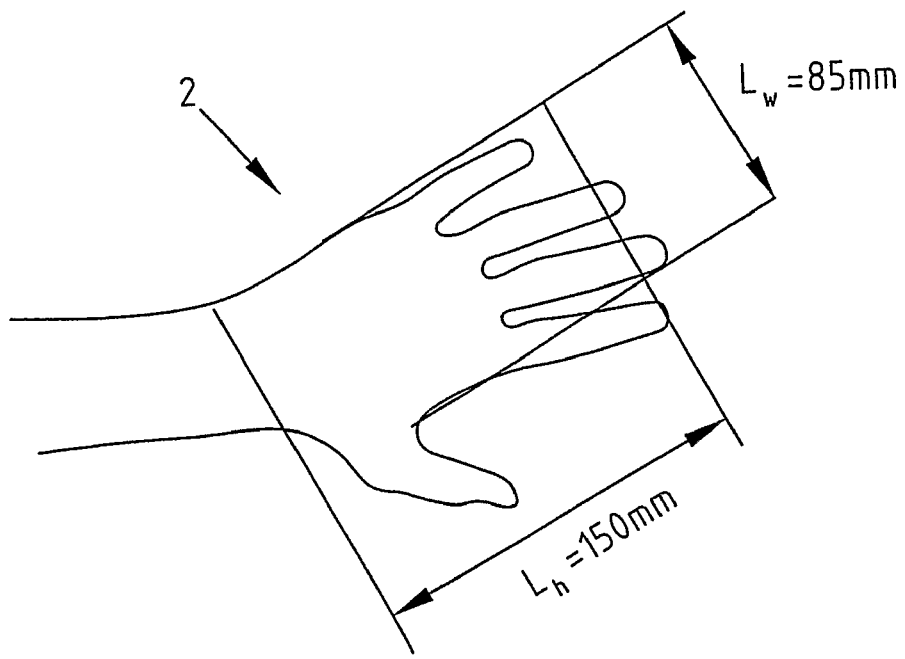
FIG. 5 is a schematic top view of an average hand.
Figure 6:
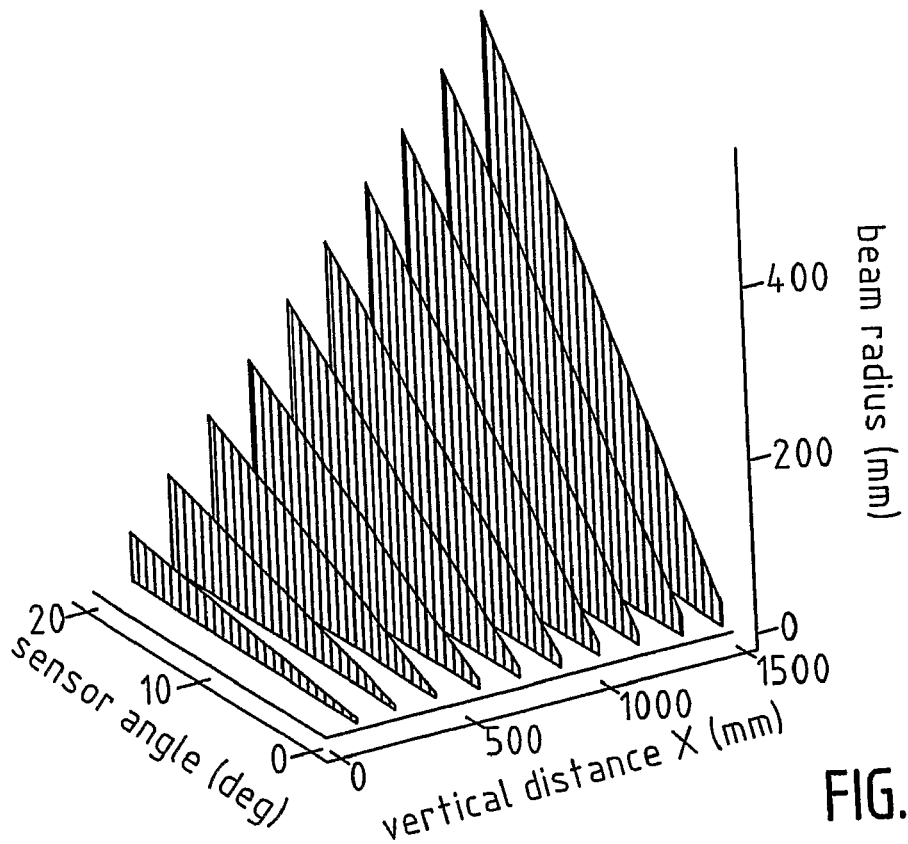
FIG. 6 is a three-dimensional graph showing beam radius against beam angle and vertical distance.
Figure 7:
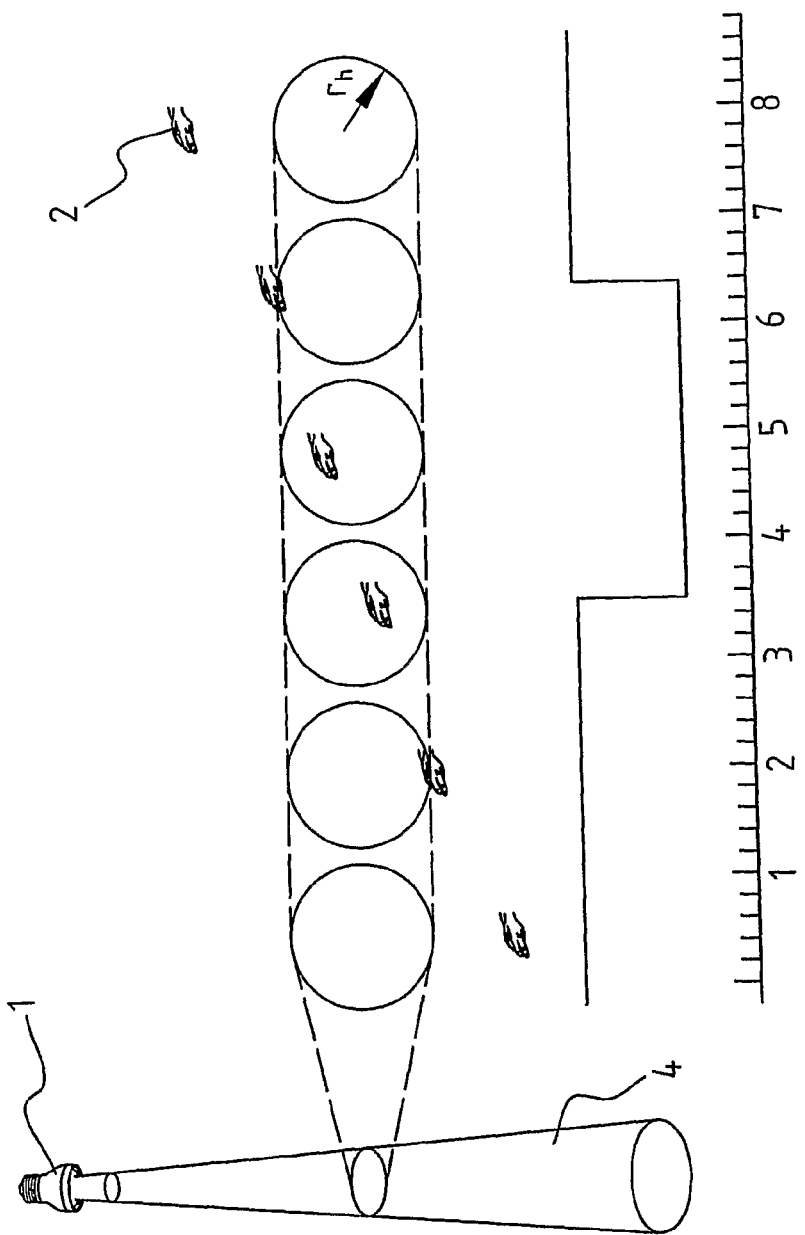
FIG. 7 shows schematically the movement of a hand in and out of the beam and the related graph of the time-of-flight against time.
Figure 8:
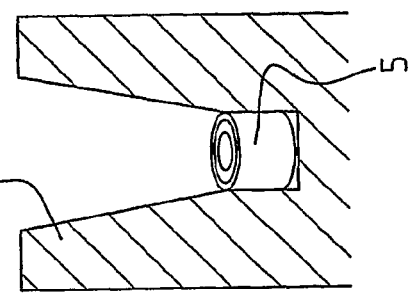
FIG. 8 is a schematic cross-sectional view of an ultrasonic transceiver and a horn.

The ultrasonic beam cone angle is important to provide reliable hand control. In FIG. 4 the beam radius at the reference position is r. The beam radius rh at the hand position must be high enough to have optimum control by hand. During control of a lamp property the average beam radius should be equal to approximately half the length of the average hand shape as shown in FIG. 5. If the total control range is around X/2 (for a lamp/table application), the ultrasound beam angle at the minimum beam radius during control of the lamp property will be around Lh/2. For example: if Lh=150 mm and X=1.5 m, the ultrasound beam angle θ should be 11°. The relationship between the vertical distance X and the beam angle as function of the beam radius is shown in FIG. 6. Lamp control will be possible if the hand 2 is in the narrow ultrasound cone 4 as shown in FIG. 7. Reduction of a wide ultrasound beam 4 and an increase of sound pressure level (SPL) of an ultrasonic transceiver 5 may be achieved by a horn 6 as shown in FIG. 8.

In order to reduce the costs of the lamp to a minimum and to have the possibility to control all possible lighting parameters like colour, intensity, etcetera, the electronic circuit needed for carrying out the control functions is integrated in the lamp. The microprocessor used for gesture control is also integrated in the LED control microprocessor to reduce the cost even more. The integration of the ultrasound sensor in the lamp makes low cost, high volume production possible.

Figure 9:
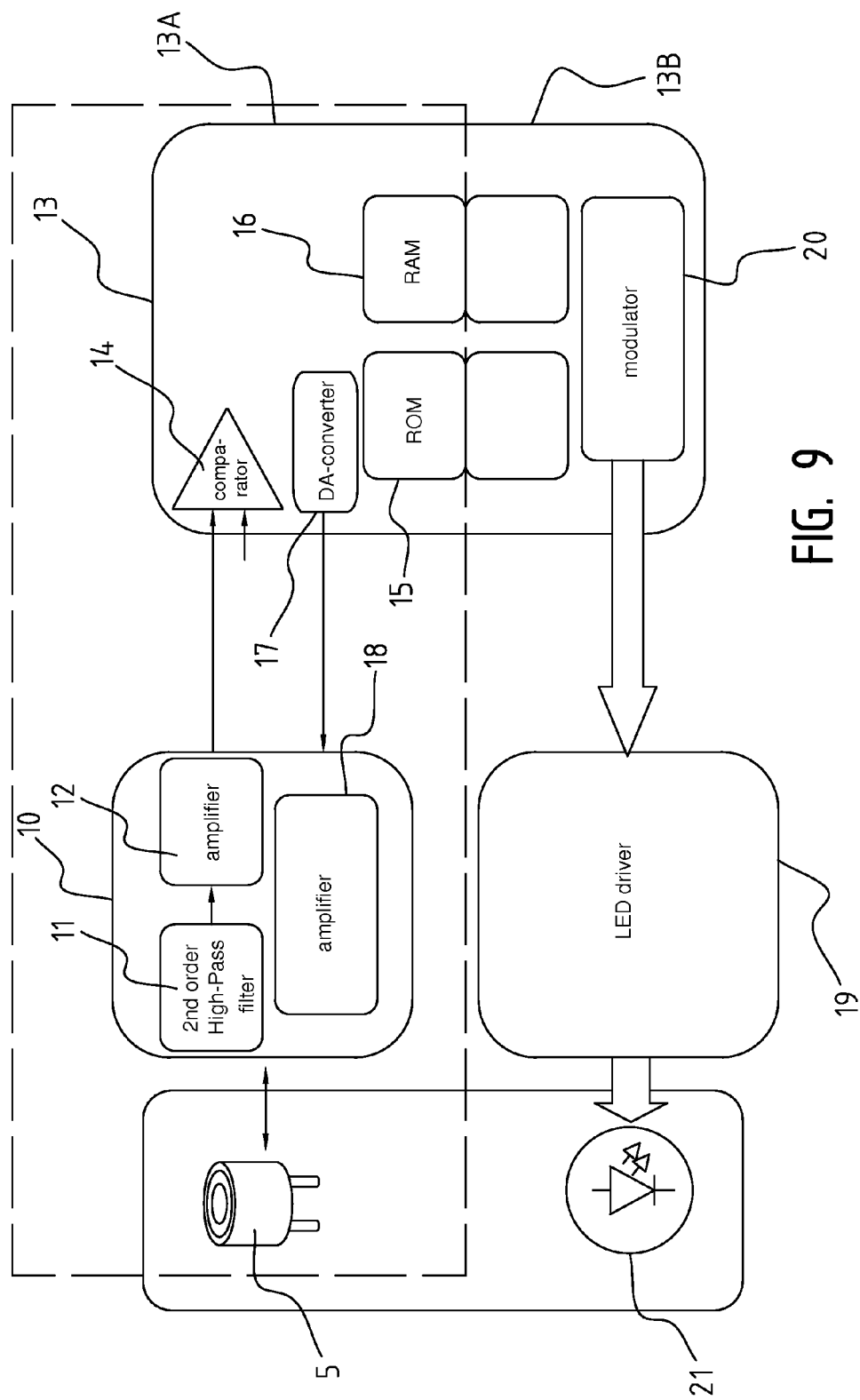
FIGS. 9 and 10 schematically show an electronic hardware implementation of the invention.
Figure 10:
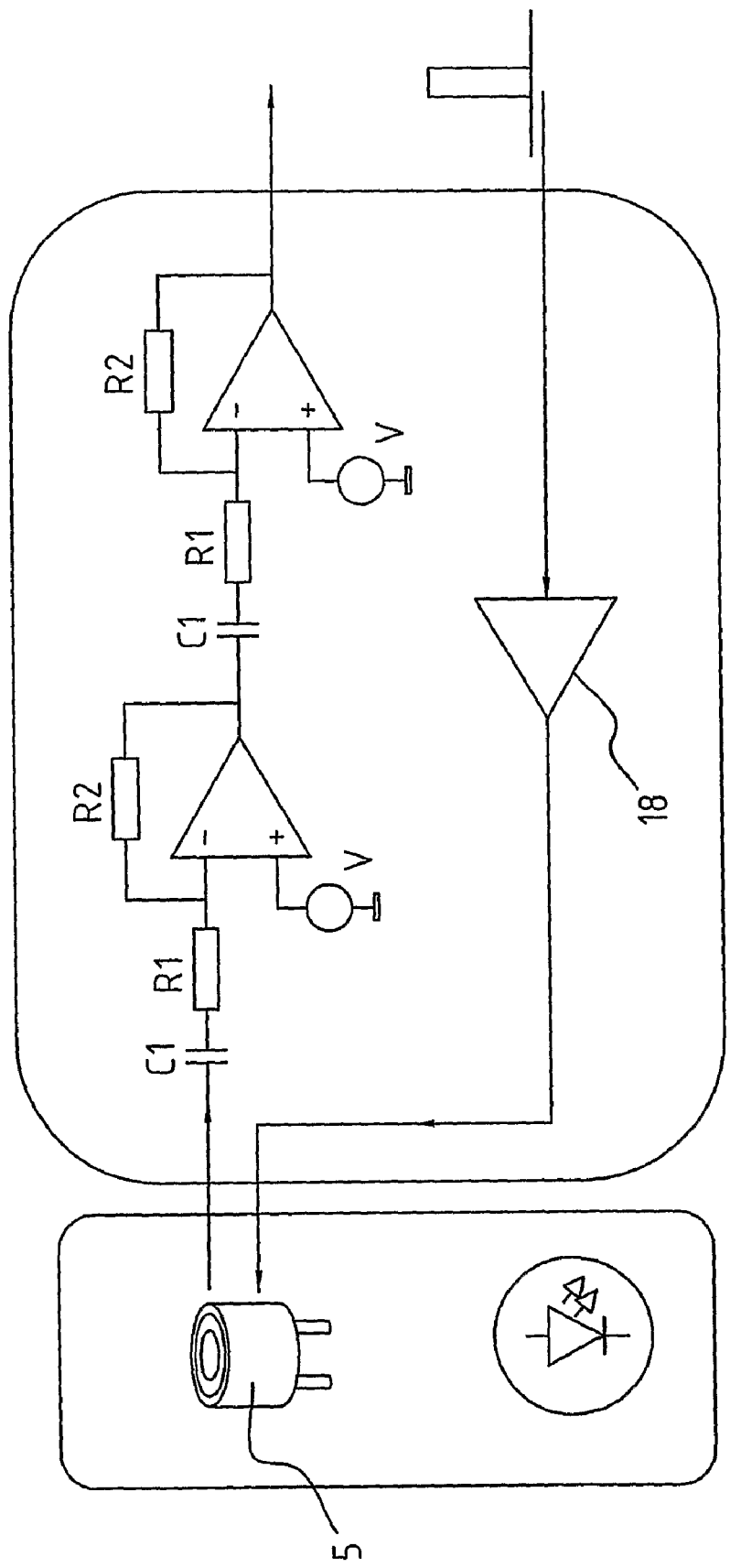

With reference to FIG. 9, as explained above the microcontroller sends a pulse to the ultrasound transmitter of the ultrasound transceiver 5. A digital pulse signal is generated by the control part 13A of a micro-controller 13, and converted by DA-converter 17 in said micro-controller 13 into an electric pulse. This pulse will be amplified by the amplifier 18 in the pre-processor 10 (shown in more detail in FIG. 10) to a value that can be used by the ultrasound transmitter part of the ultrasound transceiver 5. Then the piezo-electric ultrasound transceiver 5 sends an acoustic signal (for instance at a frequency of 40 kHz). An object will reflect this acoustic signal. The pre-processor 10 will receive the reflected signal via the ultrasound transceiver 5. In order to reduce the influence of outside disturbances the signal is filtered by a 2nd order High-Pass filter 11 of for instance 20 kHz (=fc). After filtering the signal is amplified by amplifier 12 in the pre-processor 10.

Microcontroller 13 comprises a comparator 14, which creates a digital pulse signal from the electric signal received from the pre-processor 10, which can be processed by the micro-controller 13.

The micro-controller 13 further comprises a LED driver part 13B, with a modulator 20, which is connected to the LED driver 19, and part of the ROM 15 and the RAM 16, which is shared, with the control part 13A of the micro-controller.

Such a micro-controller 13, arranged to drive a LED, is well known in the art, but is further programmed to perform the control functions as described above. The micro-controller can be a simple processor, for instance of the 8051-family. The size of the ROM 15 can be as low as 2 kB and the size of the RAM 16 can be as low as 256 bytes.

Figure 11:
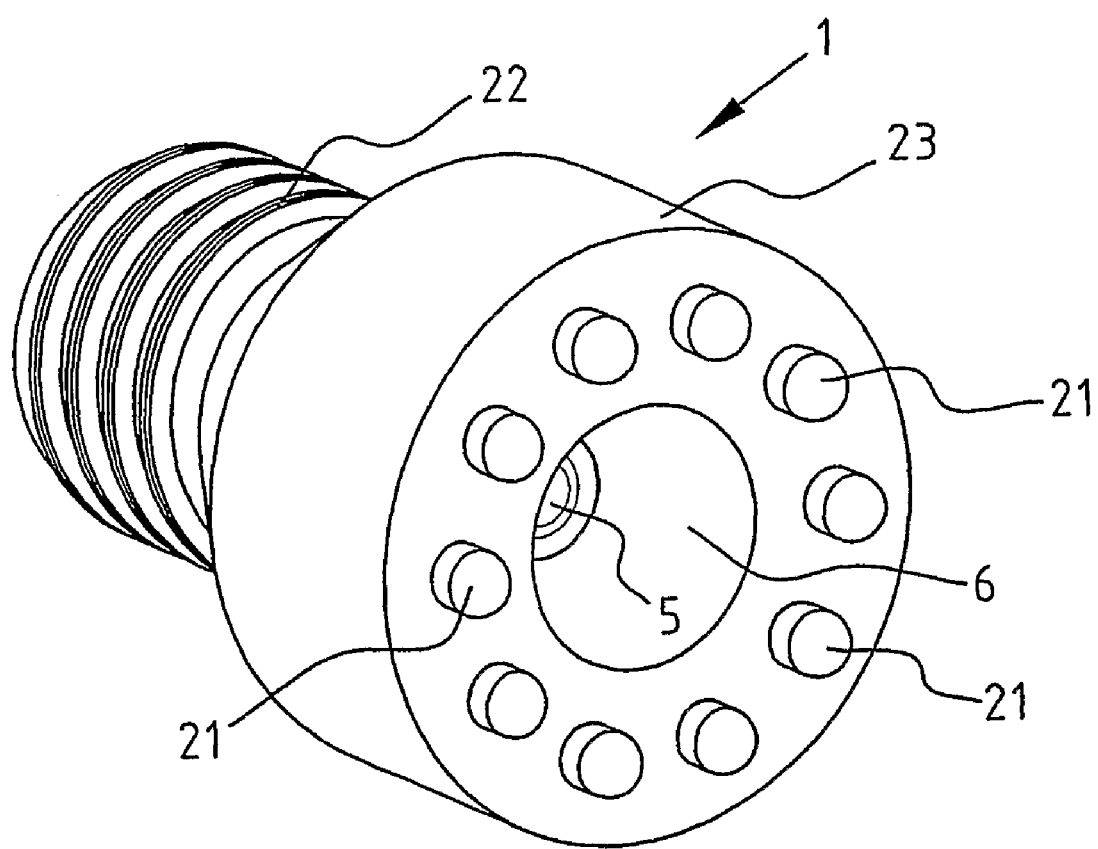
FIG. 11 is a perspective view of a lamp according to the invention.

FIG. 11 shows a lamp according to the invention comprising a housing with a standard incandescent lamp type fitting, ten LEDs 21 arranged in a circle, a transceiver 5 in a horn 6. All the electronic components like the micro-controller 13, pre-processor 10 and LED driver 19 are built-in in the housing 23. Thereby a very compact lighting system is obtained, which requires no further external accessories to be operated and controlled.

Now with reference to FIGS. 12-18 an extended lighting system is described that allows control of light parameters by gesture (e.g. hand displacement) in a XY-plane, which extends perpendicular to the Z-axis, being the axis of the light beam of the lamp. This will introduce additional possibilities for gesture light control, which can be combined with the above described method for gesture light control in the Z-direction based on time-of-flight measurements. For example it is possible to pull or push the light beam by hand movement in a certain direction. Also light control is possible for example by hand movement in a circular motion. By using also the time-of-flight determination as described above, a combination of two light controls is possible, like light beam deviation and light intensity could be controlled at the same time. Alternatively the gestures in the XY-plane can be used for switching from controlling one light beam property to another light beam property.

A first embodiment is described with reference to FIGS. 12-14. According to FIG. 12 the lamp 1 is provided with three piezoelectric ultrasound transceivers 5 mounted in a triangular shape, which are arranged such that the axes of their ultrasound beams extend parallel to the axis of the light beam 4 and in said light beam 4. The position of an object, such as the hand 2 in the XY-plane, is determined by object detection by said three transceivers 5. Said position is determined by sequentially transmitting an acoustic pulse from one transceiver 5 at a time. Each of the three transceivers 5 determines if a reflected signal is received after each pulse is sent by one of said transceivers 5.

The object position determined by this sequential transmitting and parallel receiving method is translated into a binary code. From this code the XY-position of the object is determined, and is translated into light control instructions, like light beam deviation or other light controls like colour, intensity, focus, etcetera.

Figures 12, 13:
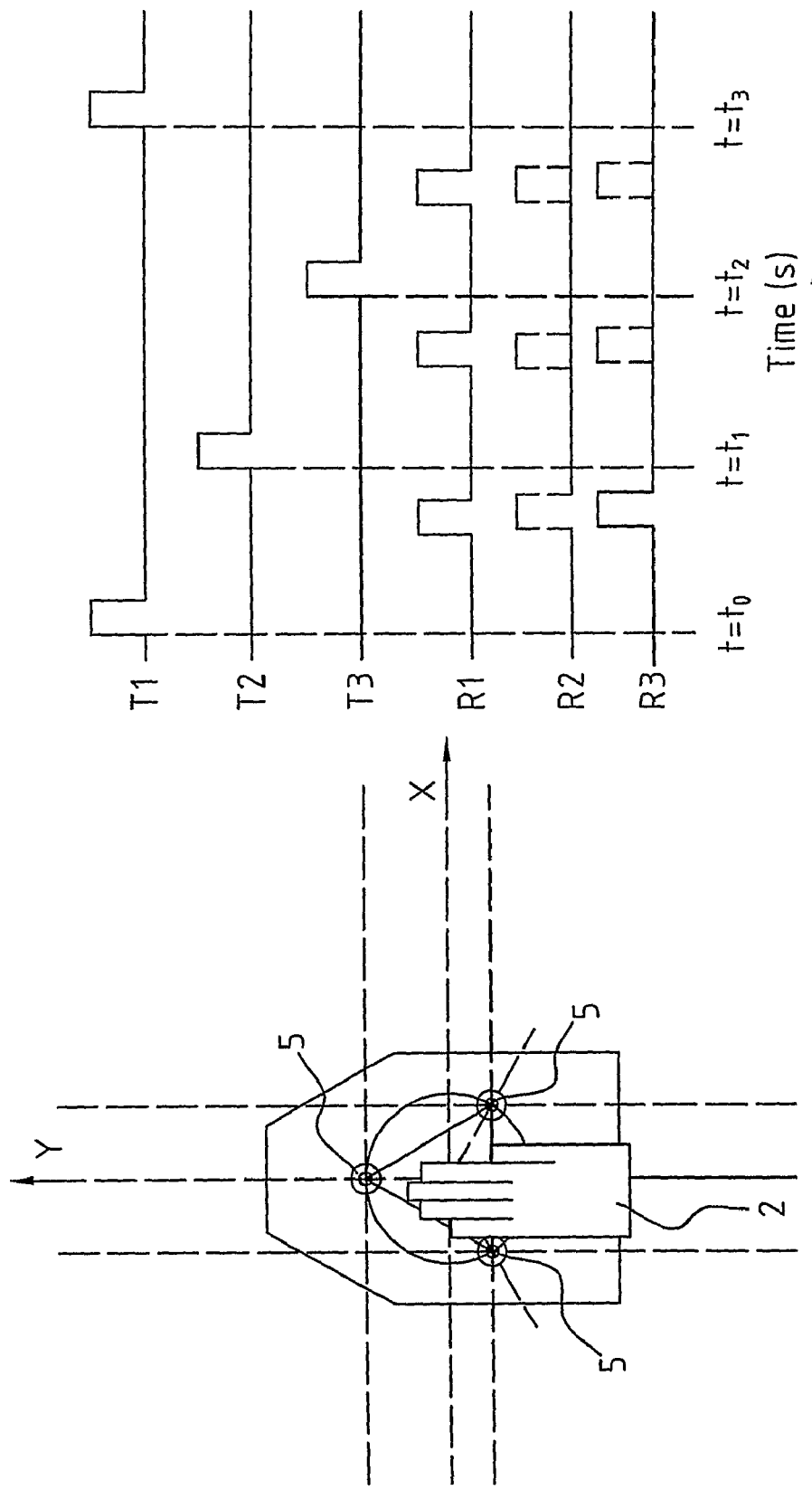
FIG. 12 is a schematic top view of a first and third embodiment of a system for determining the movement of a hand in a plane by using ultrasonic pulses.
FIG. 13 is a time diagram showing the echoes of ultrasonic pulses in the system of FIG. 12.
Figure 14A:
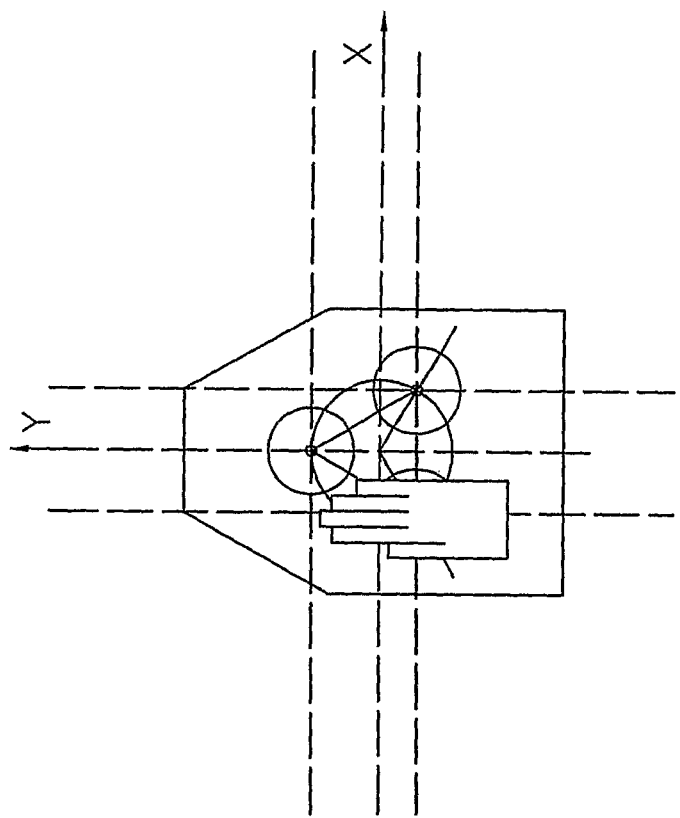
FIGS. 14A-14H schematically show the movement of a hand in the system of FIG. 12.
Figure 14B:
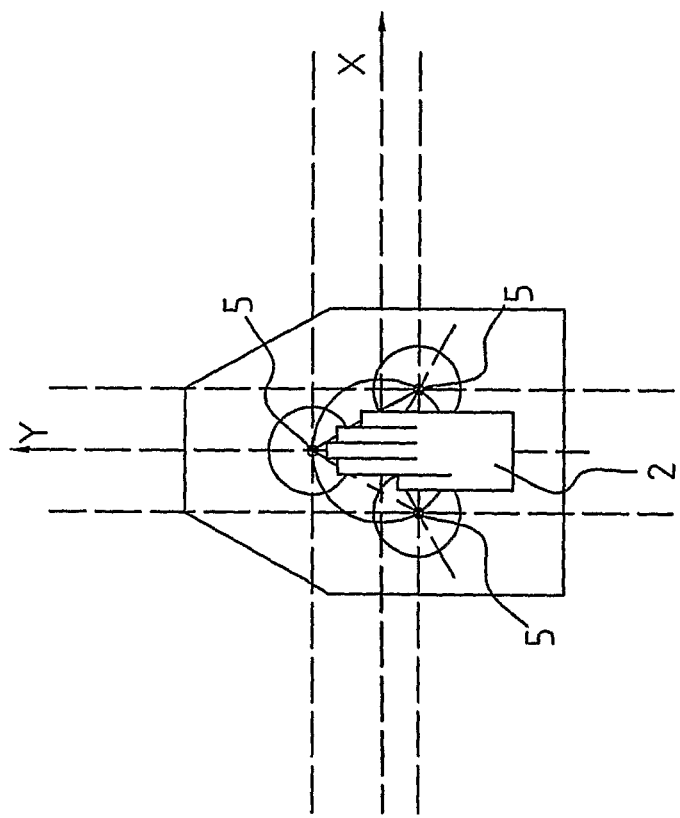
Figure 14C:
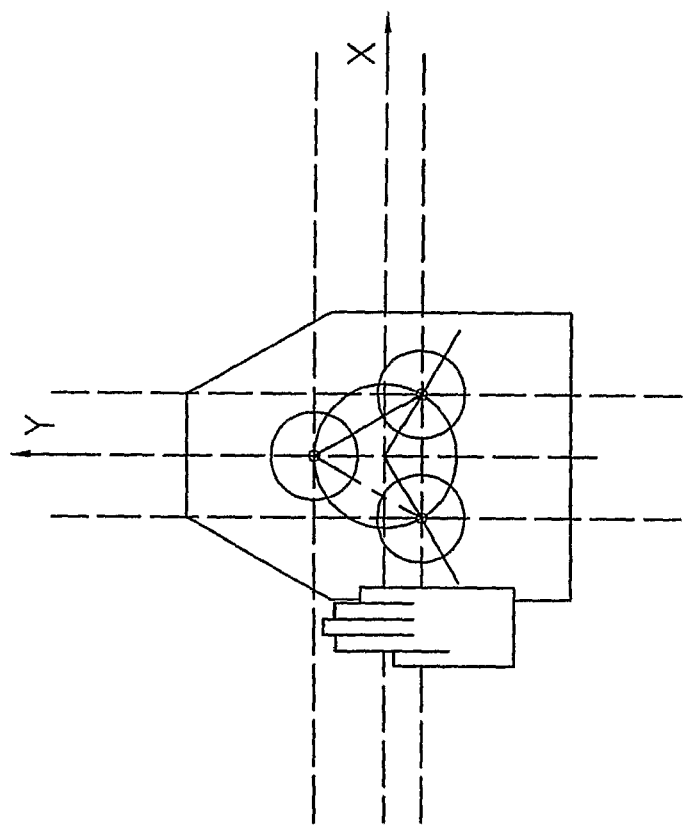
Figure 14D:
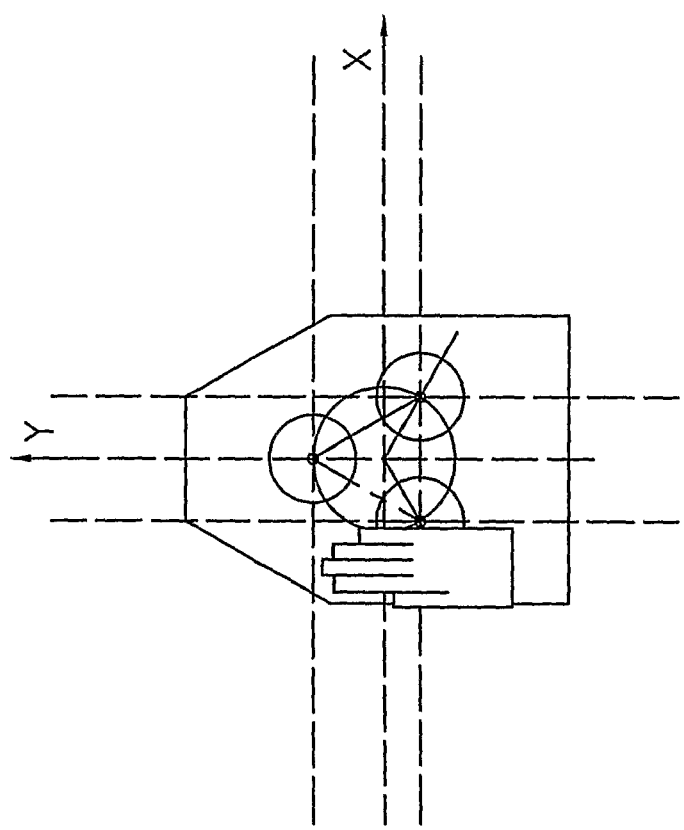
Figure 14F:
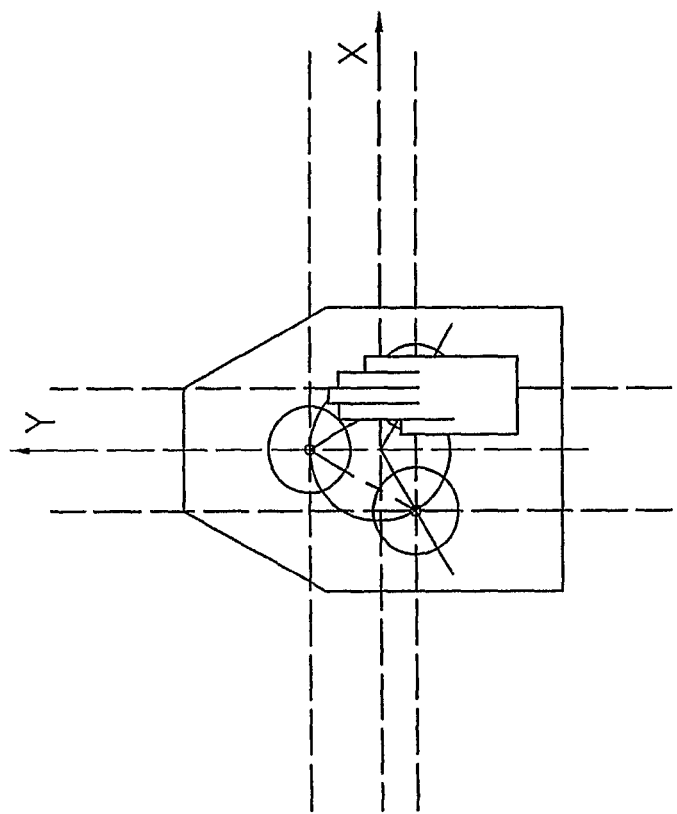
Figure 14E:
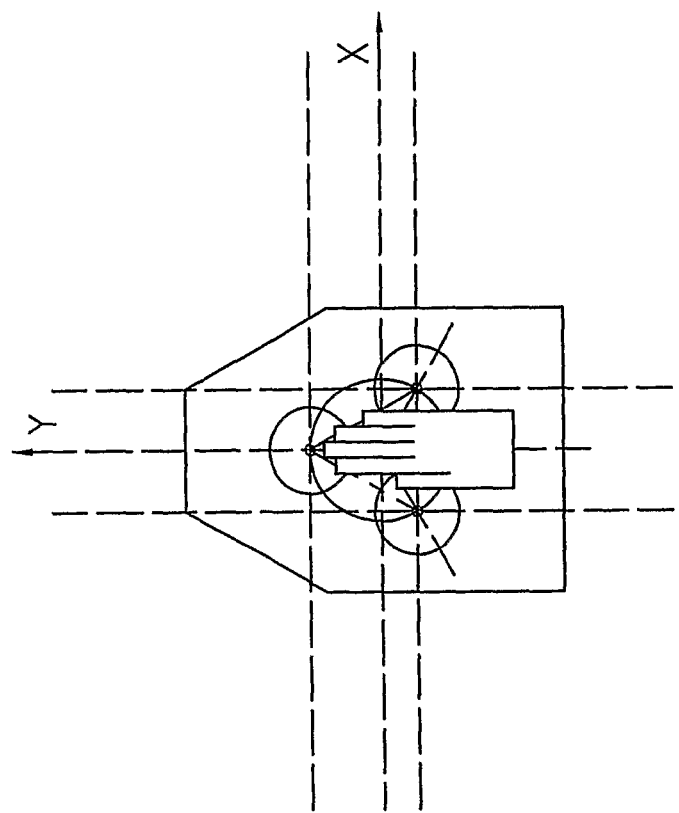
Figure 14H:
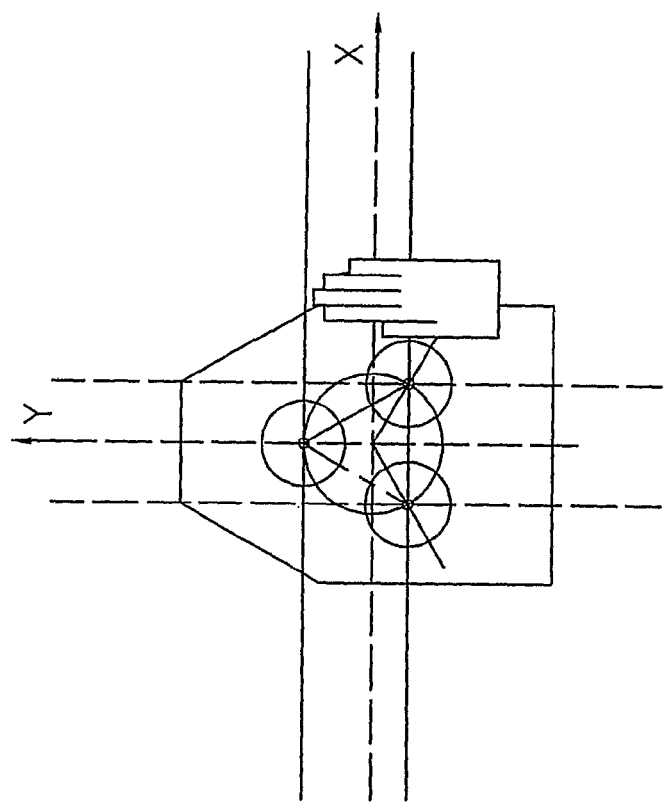
Figure 14G:
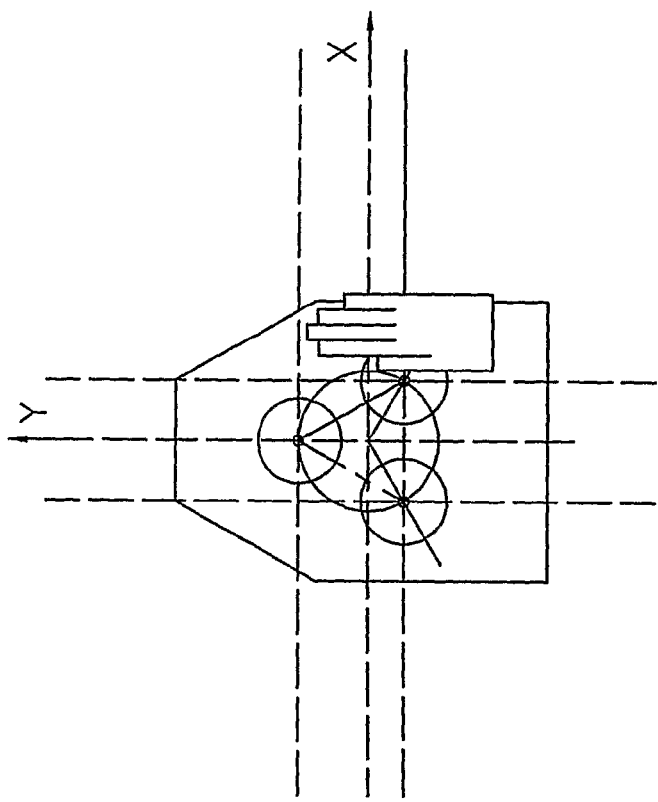

In FIG. 13 a time diagram is given of the proposed method. The three transceivers subsequently send acoustic signals on three time intervals t0, t1 and t2. The three transceivers will determine if an echo signal sent by a transmitter is received, which depends on the position of the hand 2. In FIG. 13 a dotted block indicates that the received echo signal strength is below a predetermined threshold and the echo signal is given value 0. If the echo signal strength is equal to or above said threshold the echo signal is given the value 1. This echo information is represented in table 1.

TABLE 1 example of information of sequential transmitting
and parallel receiving method

| Time | Sequential Transmitting | | | Parallel Receiving | | |
|---|---|---|---|---|---|---|
| | T1 | T2 | T3 | R1 | R2 | R3 |
| $t = t_0$ | $T1_0 = 1$ | $T2_0 = 0$ | $T3_0 = 0$ | $R1_0 = 1$ | $R2_0 = 0$ | $R3_0 = 1$ |
| $t = t_1$ | $T1_1 = 0$ | $T2_1 = 1$ | $T3_1 = 0$ | $R1_1 = 1$ | $R2_1 = 0$ | $R3_1 = 0$ |
| $t = t_2$ | $T1_2 = 0$ | $T2_2 = 0$ | $T3_2 = 1$ | $R1_2 = 1$ | $R2_2 = 0$ | $R3_2 = 0$ |

This binary information is translated into a position in the XY-plane by following equations:

$$x = \sum_{p=0}^{n-1} (T_{p+1})_p \cdot \left[ \sum_{k=0}^{n-1} (R_{k+1})_p \cdot (Wx_{k+1})_p \right]$$

$$y = \sum_{q=0}^{n-1} (T_{q+1})_q \cdot \left[ \sum_{m=0}^{n-1} (R_{m+1})_q \cdot (Wy_{m+1})_q \right]$$

Where n is the total number of transceivers
Wx and Wy are weight factors
k and m are transceiver indices The X and Y value determine the actual position of the hand 2 in the XY-plane. If the hand 2 is moving to a certain direction the X, Y values change. From these values the hand displacement direction is known.

If the hand 2 moves outside the control range in the X or Y direction or both, the values are fixed to a constant value. The movement direction and distance of the hand 2 and/or its actual position will be translated into a light control instruction, e.g. a deflection action of the light beam in a certain XY direction.

A hand generally has a spherical shape, which causes beam scattering effects. To reduce the influence of scattering on the measurement result horns of e.g. 10 degrees beam angle are preferably placed on the transceivers. An extra advantage for using a 10 degrees horn is a higher sound pressure level of the sent signals.

The above method provides at least four/five valid steps in each direction. The calculated XY-positions are translated into a light control value in the user interface.

As an example a sequence of hand movements comprising 8 steps is shown in FIGS. 14A-14H, and for each step a table with transmitted and received binary values for each transceiver is shown below, with the calculated values for X and Y.

TABLE 2a (FIG. 14A, step 1): X = 0, Y = −0.5

| Time | Sequential Transmitting | | | Parallel Receiving | | |
|---|---|---|---|---|---|---|
| | T1 | T2 | T3 | R1 | R2 | R3 |
| $t = t_0$ | $T1_0 = 1$ | $T2_0 = 0$ | $T3_0 = 0$ | $R1_0 = 1$ | $R2_0 = 1$ | $R3_0 = 1$ |
| $t = t_1$ | $T1_1 = 0$ | $T2_1 = 1$ | $T3_1 = 0$ | $R1_1 = 1$ | $R2_1 = 1$ | $R3_1 = 1$ |
| $t = t_2$ | $T1_2 = 0$ | $T2_2 = 0$ | $T3_2 = 1$ | $R1_2 = 1$ | $R2_2 = 1$ | $R3_2 = 1$ |

TABLE 2b (FIG. 14B, step 2): X = −0.5, Y = −0.5

| Time | Sequential Transmitting | | | Parallel Receiving | | |
|---|---|---|---|---|---|---|
| | T1 | T2 | T3 | R1 | R2 | R3 |
| $t = t_0$ | $T1_0 = 1$ | $T2_0 = 0$ | $T3_0 = 0$ | $R1_0 = 1$ | $R2_0 = 0$ | $R3_0 = 1$ |
| $t = t_1$ | $T1_1 = 0$ | $T2_1 = 1$ | $T3_1 = 0$ | $R1_1 = 0$ | $R2_1 = 0$ | $R3_1 = 0$ |
| $t = t_2$ | $T1_2 = 0$ | $T2_2 = 0$ | $T3_2 = 1$ | $R1_2 = 1$ | $R2_2 = 0$ | $R3_2 = 0$ |

TABLE 2c (FIG. 14C, step 3): X = −1, Y = −0.5

| Time | Sequential Transmitting | | | Parallel Receiving | | |
|---|---|---|---|---|---|---|
| | T1 | T2 | T3 | R1 | R2 | R3 |
| $t = t_0$ | $T1_0 = 1$ | $T2_0 = 0$ | $T3_0 = 0$ | $R1_0 = 1$ | $R2_0 = 0$ | $R3_0 = 0$ |
| $t = t_1$ | $T1_1 = 0$ | $T2_1 = 1$ | $T3_1 = 0$ | $R1_1 = 0$ | $R2_1 = 0$ | $R3_1 = 0$ |
| $t = t_2$ | $T1_2 = 0$ | $T2_2 = 0$ | $T3_2 = 1$ | $R1_2 = 0$ | $R2_2 = 0$ | $R3_2 = 0$ |

TABLE 2d (FIG. 14D, step 4): object outside range X, Y not changed

| Time | Sequential Transmitting | | | Parallel Receiving | | |
|---|---|---|---|---|---|---|
| | T1 | T2 | T3 | R1 | R2 | R3 |
| $t = t_0$ | $T1_0 = 1$ | $T2_0 = 0$ | $T3_0 = 0$ | $R1_0 = 0$ | $R2_0 = 0$ | $R3_0 = 0$ |
| $t = t_1$ | $T1_1 = 0$ | $T2_1 = 1$ | $T3_1 = 0$ | $R1_1 = 0$ | $R2_1 = 0$ | $R3_1 = 0$ |
| $t = t_2$ | $T1_2 = 0$ | $T2_2 = 0$ | $T3_2 = 1$ | $R1_2 = 0$ | $R2_2 = 0$ | $R3_2 = 0$ |

TABLE 2e (FIG. 14E, step 5): X = 0, Y = −0.5

| Time | Sequential Transmitting | | | Parallel Receiving | | |
|---|---|---|---|---|---|---|
| | T1 | T2 | T3 | R1 | R2 | R3 |
| $t = t_0$ | $T1_0 = 1$ | $T2_0 = 0$ | $T3_0 = 0$ | $R1_0 = 1$ | $R2_0 = 1$ | $R3_0 = 1$ |
| $t = t_1$ | $T1_1 = 0$ | $T2_1 = 1$ | $T3_1 = 0$ | $R1_1 = 1$ | $R2_1 = 1$ | $R3_1 = 1$ |
| $t = t_2$ | $T1_2 = 0$ | $T2_2 = 0$ | $T3_2 = 1$ | $R1_2 = 1$ | $R2_2 = 1$ | $R3_2 = 1$ |

TABLE 2f (FIG. 14F, step 6): X = +0.5, Y = −0.5

| Time | Sequential Transmitting | | | Parallel Receiving | | |
|---|---|---|---|---|---|---|
| | T1 | T2 | T3 | R1 | R2 | R3 |
| $t = t_0$ | $T1_0 = 1$ | $T2_0 = 0$ | $T3_0 = 0$ | $R1_0 = 0$ | $R2_0 = 0$ | $R3_0 = 0$ |
| $t = t_1$ | $T1_1 = 0$ | $T2_1 = 1$ | $T3_1 = 0$ | $R1_1 = 0$ | $R2_1 = 1$ | $R3_1 = 1$ |
| $t = t_2$ | $T1_2 = 0$ | $T2_2 = 0$ | $T3_2 = 1$ | $R1_2 = 0$ | $R2_2 = 1$ | $R3_2 = 0$ |

TABLE 2g (FIG. 14G, step 7): X = +1, Y = −0.5

| Time | Sequential Transmitting | | | Parallel Receiving | | |
|---|---|---|---|---|---|---|
| | T1 | T2 | T3 | R1 | R2 | R3 |
| $t = t_0$ | $T1_0 = 1$ | $T2_0 = 0$ | $T3_0 = 0$ | $R1_0 = 0$ | $R2_0 = 0$ | $R3_0 = 0$ |
| $t = t_1$ | $T1_1 = 0$ | $T2_1 = 1$ | $T3_1 = 0$ | $R1_1 = 0$ | $R2_1 = 1$ | $R3_1 = 0$ |
| $t = t_2$ | $T1_2 = 0$ | $T2_2 = 0$ | $T3_2 = 1$ | $R1_2 = 1$ | $R2_2 = 0$ | $R3_2 = 0$ |

TABLE 2h (FIG. 14H, step 8): object outside range X, Y not changed

| | Sequential Transmitting | | | Parallel Receiving | | |
|---|---|---|---|---|---|---|
| Time | T1 | T2 | T3 | R1 | R2 | R3 |
| $t = t_0$ | $T1_0 = 1$ | $T2_0 = 0$ | $T3_0 = 0$ | $R1_0 = 0$ | $R2_0 = 0$ | $R3_0 = 0$ |
| $t = t_1$ | $T1_1 = 0$ | $T2_1 = 1$ | $T3_1 = 0$ | $R1_1 = 0$ | $R2_1 = 0$ | $R3_1 = 0$ |
| $t = t_2$ | $T1_2 = 0$ | $T2_2 = 0$ | $T3_2 = 1$ | $R1_2 = 0$ | $R2_2 = 0$ | $R3_2 = 0$ |

Now with reference to FIGS. 15-18 a second embodiment for determining the hand position in the XY-plane will be described. The method is comparable with the above described method, but distinguishes itself in that only one ultrasound transceiver 5 is used, which is rotated in the lamp around the lamp axis, such that object localization can be achieved in one revolution.

Figure 15:
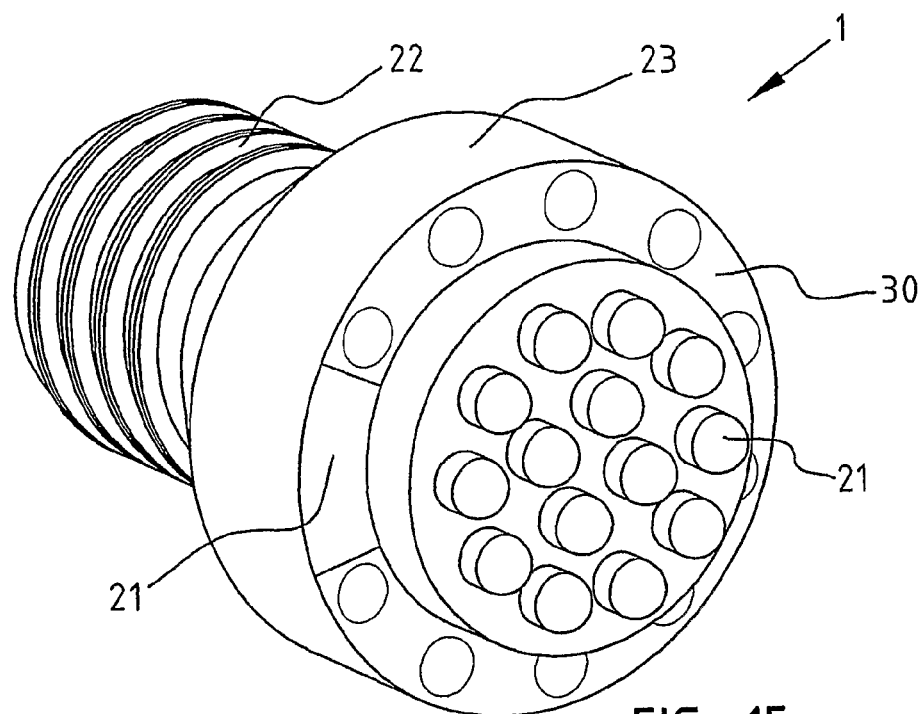
FIG. 15 shows a perspective view of a lamp according to a second embodiment of a system for determining the movement of a hand in a plane by using ultrasonic pulses.
Figure 16:
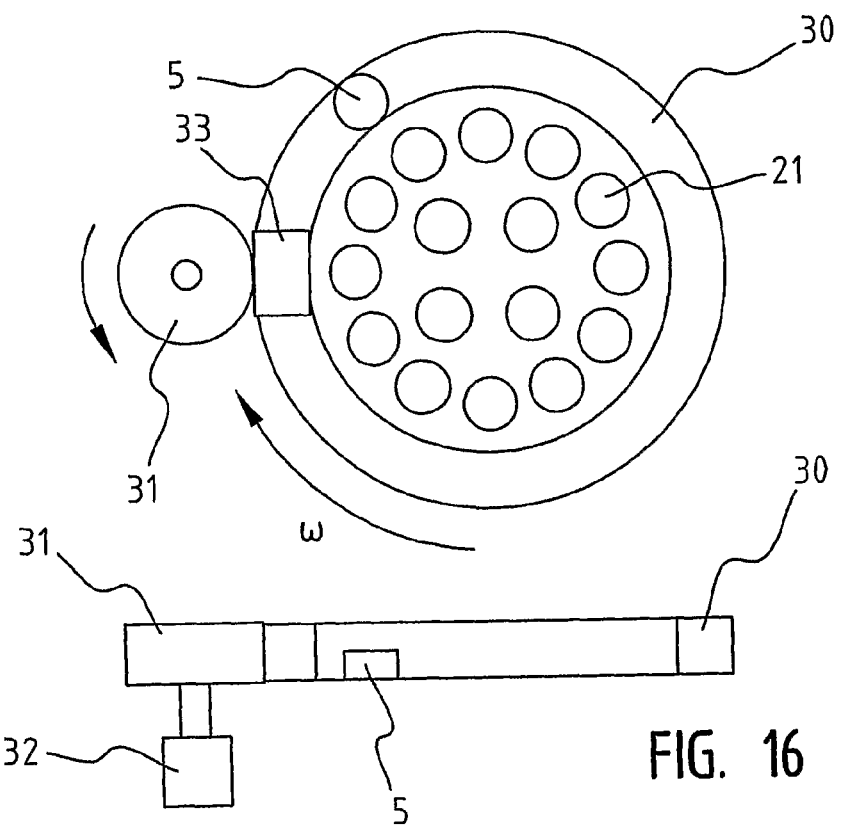
FIG. 16 shows a schematic front view and a schematic side view of lamp of FIG. 15.

According to FIGS. 15 and 16 the lamp 1 comprises an array of LEDs 21 and a piezoelectric ultrasound transceiver 5 mounted on a rotating cogwheel 30, such that the transceiver 5 moves along the circumference of the lamp 1. The cogwheel 30 is driven by another small cogwheel 31, which is connected to a stepper motor 32. The transceiver rotation speed is higher than the hand movement in the XY-plane. For example if the transceiver rotation speed is 4 Hz, then the time needed for one revolution of the transceiver is 250 ms. Within this period the xy-position of the object is detected, in which period the hand 2 will not have been moved significantly.

In order to determine the transceiver position along the circumference of the lamp, a reference transceiver position is defined by a blocking filter 33 for ultrasound signals arranged at said position. The reference calibration to determine said reference position can be carried out in one transceiver revolution. The rotation of the transceiver 5 will be activated when an object, such as hand 2 is placed in the transceiver detection range.

Figure 17:
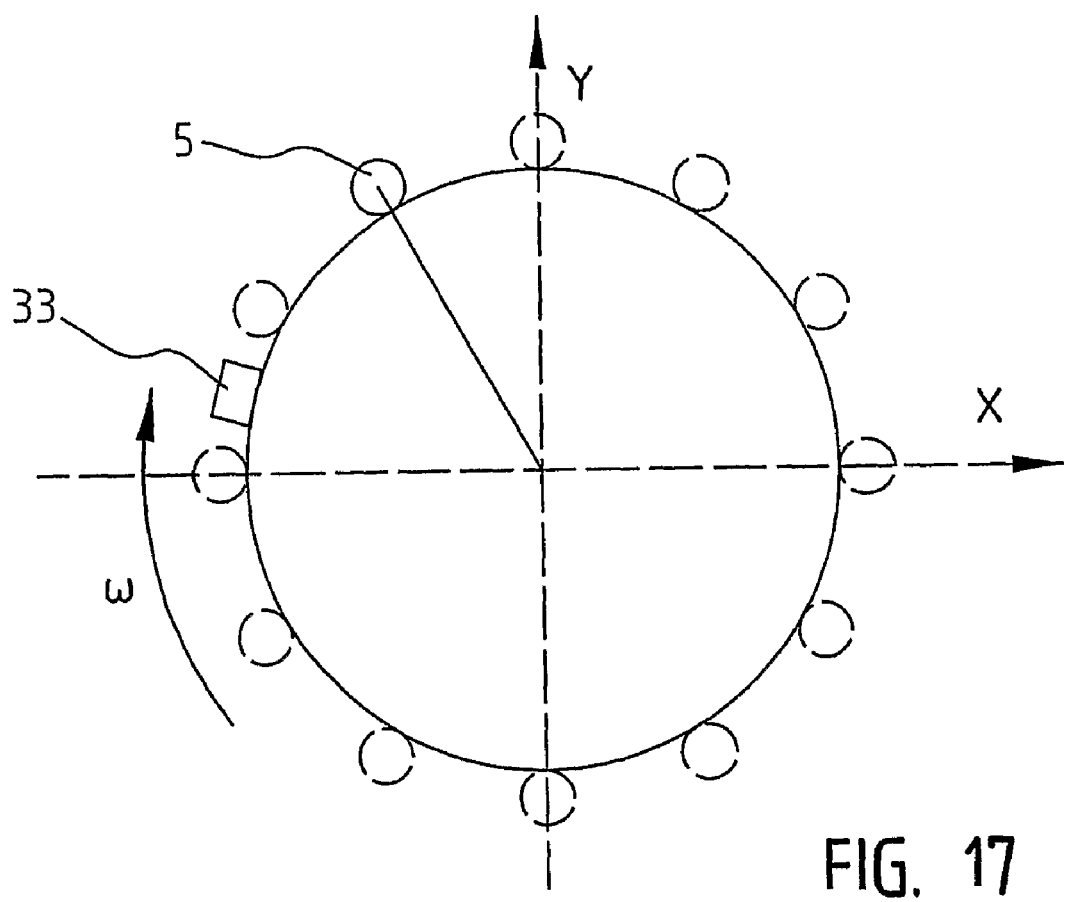
FIG. 17 shows a schematic view of the rotation of a ultrasonic transceiver in the lamp of FIG. 15.

Said position is determined by transmitting an acoustic pulse from said transceiver 5 and determining if a reflected signal is received, and then rotate said transceiver 5 to the next position and repeat this step, until such determination is achieved at twelve positions, as shown in FIG. 17.

Figure 18:
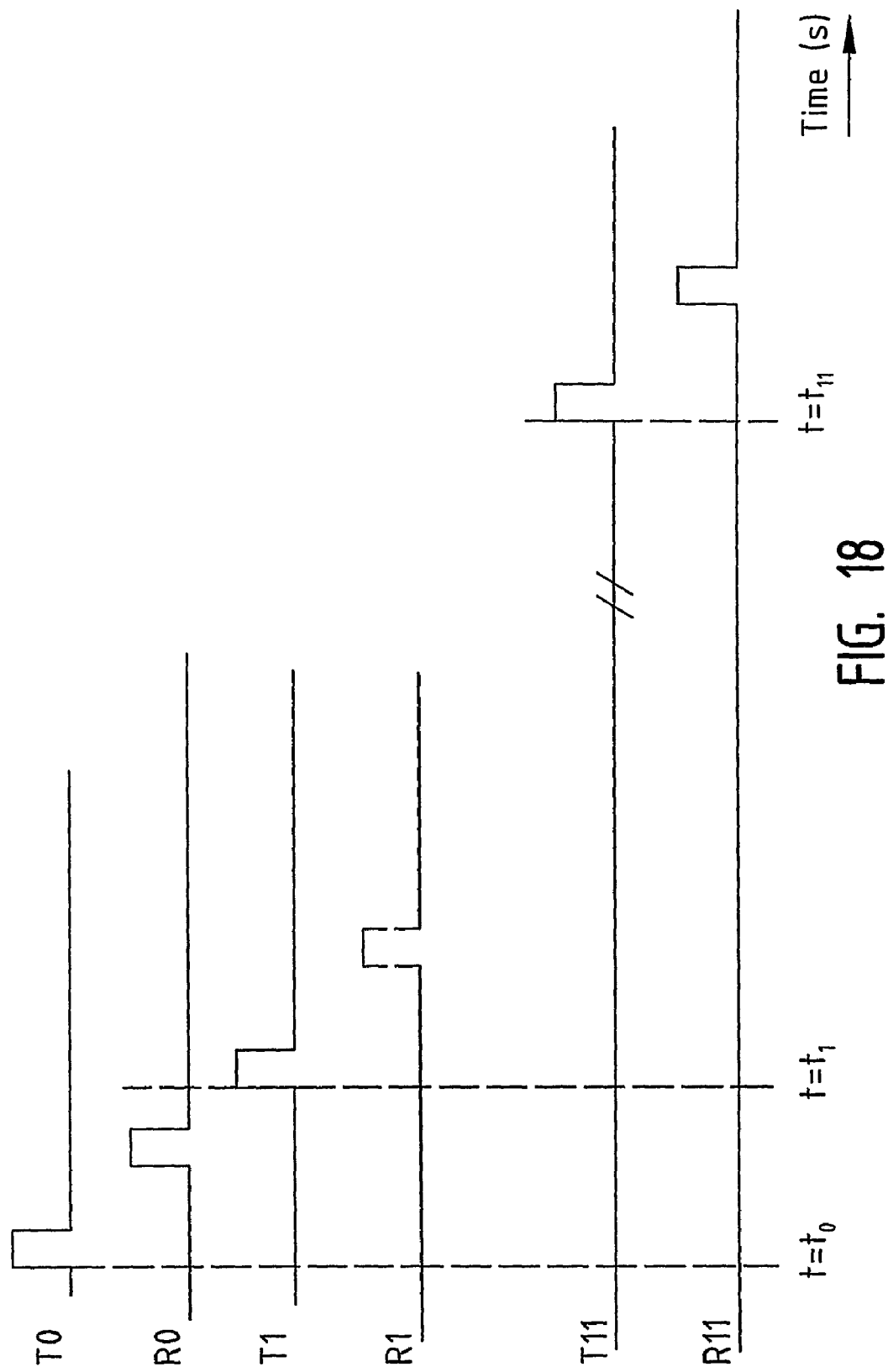
FIG. 18 is a time diagram showing the echoes of ultrasonic pulses in the lamp of FIG. 15.

In FIG. 18 a time diagram is given of the proposed method. The transceiver subsequently sends acoustic signals (T0 . . . T11) on twelve time intervals t0, t1 . . . t11. At each step the transceiver 5 will determine if an echo signal is received (R0 . . . R11), which depends on the position of the hand 2. In FIG. 18 a dotted block indicates that the received echo signal strength is below a predetermined threshold and the echo signal is given value 0. If the echo signal strength is equal to or above said threshold the echo signal is given the value 1. An example of this echo information is shown in table 3.

TABLE 3

| Time | Transmitter T | Receiver R |
|---|---|---|
| $t = t_0$ | $T_0 = 1$ | $R_0 = 1$ |
| $t = t_1$ | $T_1 = 1$ | $R_1 = 1$ |
| $t = t_2$ | $T_2 = 1$ | $R_2 = 1$ |
| $t = t_3$ | $T_3 = 1$ | $R_3 = 1$ |
| $t = t_4$ | $T_4 = 1$ | $R_4 = 0$ |
| $t = t_5$ | $T_5 = 1$ | $R_5 = 0$ |
| $t = t_6$ | $T_6 = 1$ | $R_6 = 0$ |
| $t = t_7$ | $T_7 = 1$ | $R_7 = 0$ |
| $t = t_8$ | $T_8 = 1$ | $R_8 = 0$ |
| $t = t_9$ | $T_9 = 1$ | $R_9 = 0$ |
| $t = t_{10}$ | $T_{10} = 1$ | $R_{10} = 0$ |
| $t = t_{11}$ | $T_{11} = 1$ | $R_{11} = 1$ |

TABLE 3-continued

| Time | Transmitter T | Receiver R |
|---|---|---|

This binary information is translated into a position in the XY-plane by the following equations:

$$x = \sum_{p=0}^{n-1} T_p \cdot R_p \cdot Wx_p$$

$$y = \sum_{p=0}^{n-1} T_p \cdot R_p \cdot Wy_p$$

Where n is the total number of measurements during one sensor revolution Wx and Wy are weight factors The weight factor values depend on the transceiver position during the measurement compared to the reference position.

Now with reference to FIGS. 19-20 a third embodiment for determining the hand position in the XY-plane will be described.

Figure 19:
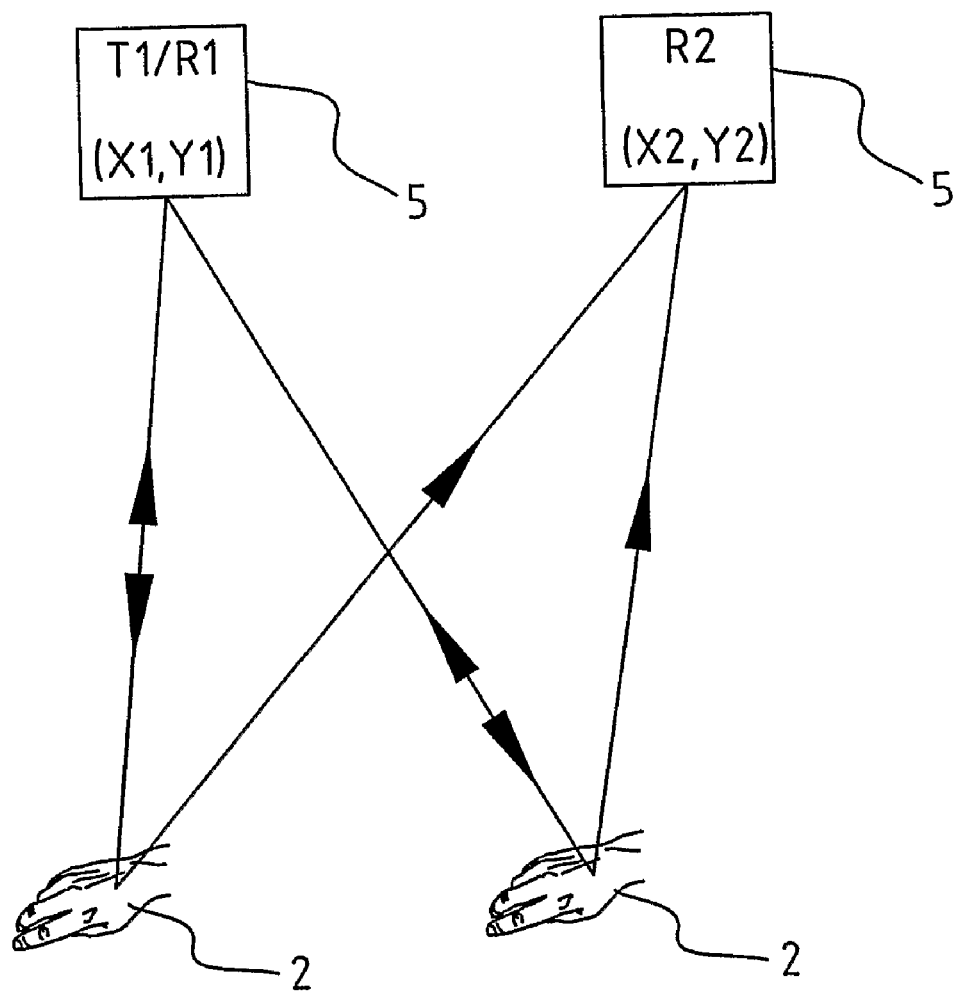
FIGS. 19 and 20 are schematic views of a third embodiment of a system for determining the movement of a hand in a plane by using ultrasonic pulses.
Figure 20:
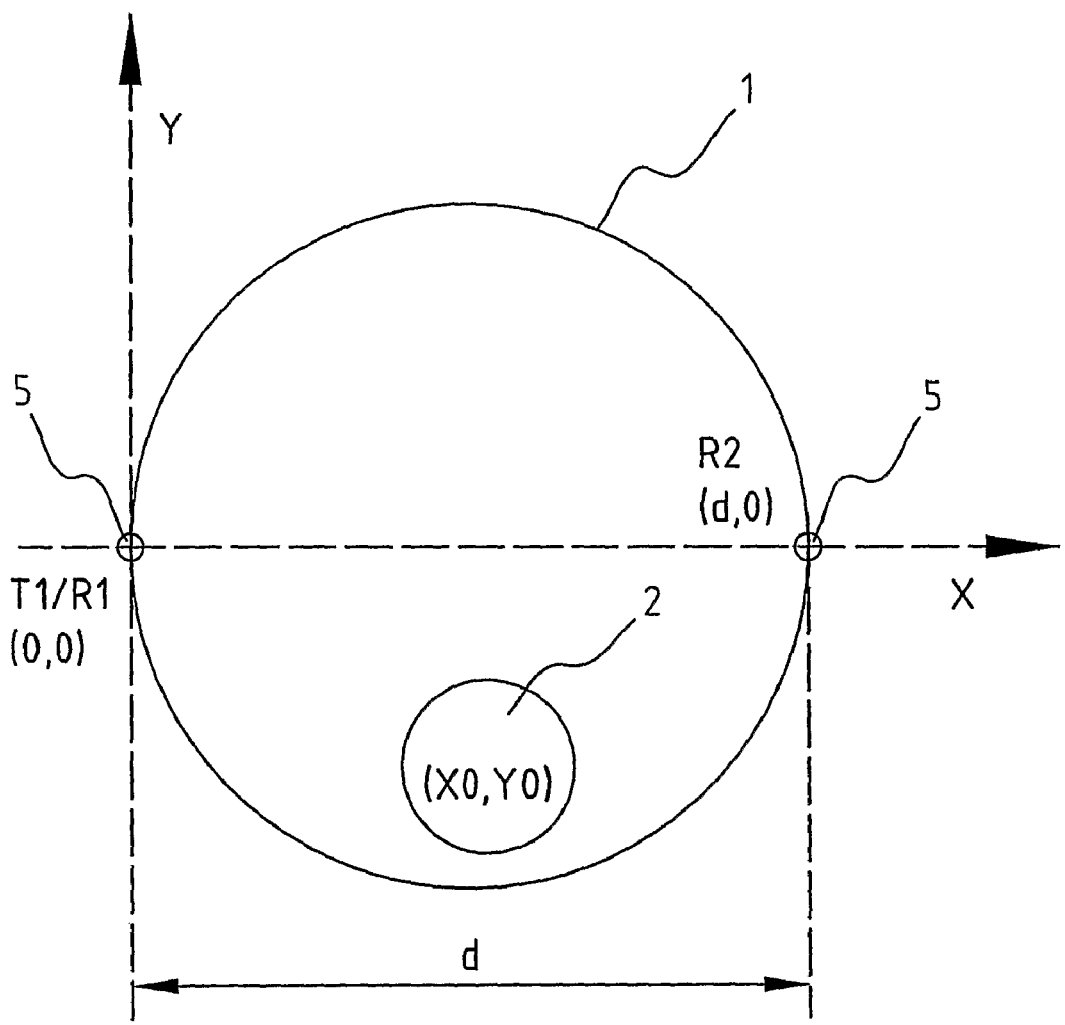

According to FIGS. 19 and 20 the lamp 1 is provided with two piezoelectric ultrasound transceivers 5, which are arranged such that the axes of their ultrasound beams extend parallel to the axis of the light beam 4 and in said light beam 4. Alternatively, in order to achieve more accurate results, more transceivers can be applied, for instance three transceivers, which are positioned in a triangle as in FIG. 12. The position of an object, such as the hand 2 in the XY-plane, is determined by determining the time-of-flight by said transceivers 5. Said position is determined by sequentially transmitting an acoustic pulse from one transceiver 5 at a time. After each pulse is sent by one of said transceivers 5, each of the transceivers 5 determines the time-of-flight of the reflected signal in accordance with the earlier described method. In principle the method needs only one transmitter to send an acoustic pulse and two receivers to determine the time-of-flight of the reflected signal.

The position of the object is determined by combining the time-of-flight measurements of said two or more receivers. In order to achieve reliable determinations the distance between the ultrasound sensors must be sufficiently high. If for instance the accuracy of a time-of-flight measurement is 2 cm, for reliable position determination of an object at 1 m from the transceivers the distance between two sensors must be at least 28 cm. The ultrasound beam angle in this case must be sufficiently high.

Example 1

The number of sensors is two, one transceiver (transmitter & receiver) and one receiver.

The distance in a XY-plane can be calculated as follows:

$$v_{air} \cdot (TOF_{T1\_R1})_{t=t0} = \frac{\sqrt{(x_1 - x_0)^2 + (y_1 - y_0)^2} + \sqrt{(x_0 - x_1)^2 + (y_0 - y_1)^2}}{} = a$$

$$v_{air} \cdot (TOF_{T1\_R2})_{t=t0} = \frac{\sqrt{(x_1 - x_0)^2 + (y_1 - y_0)^2} + \sqrt{(x_0 - x_2)^2 + (y_0 - y_2)^2}}{} = b$$

where $v_{air}$=speed of sound at room temperature, is 344 m/s.

To simplify the calculations the sensors are placed in the XY-plane. The receivers are placed so that both are on the X-axis and one on the Y-axis. The only parameter that has to be defined for the sensor units is the distance d, between the sensors. With these assumptions the new coordinates for the transmitter and the receivers become:

Receivers: $R_1$=(0,0)

$R_2$=(d,0)

Transmitter: $T_1$=(0,0)

With the new coordinates above-mentioned expression become much easier to handle:

for t=$t_0$:

$$a = 2 \cdot \sqrt{(x_0)^2 + (y_0)^2} \Rightarrow \sqrt{(x_0)^2 + (y_0)^2} = \frac{a}{2}$$

$$b = \sqrt{(x_0)^2 + (y_0)^2} + \sqrt{(x_0 - d)^2 + (y_0)^2}$$

The object position $x_0, y_0$ at t=$t_0$ will be $$(x_0)_{t=t0} = \frac{\left(\frac{a^2}{2} + d^2 - b^2 - a \cdot b\right)}{2 \cdot d}$$

$$(y_0)_{t=t0} = \sqrt{\left(\frac{a}{2}\right)^2 - ((x_0)_{t=t0})^2}$$

This position at t=$t_0$ is used as the initial position of the hand.

The same measurements will be repeated at another time t=$t_1$ for detecting movement distance direction of the object.

The movement direction is calculated as follows:

$$\Delta x = (x_0)_{t=t0} - (x_0)_{t=t1}$$

$$\Delta y = (y_0)_{t=t0} - (y_0)_{t=t1}$$

If $\Delta x$ is positive then the hand moves in the left direction, if $\Delta y$ is positive then the hand moves in the downwards direction. Thus in this case the hand moves towards the southwest direction. This position change is translated into a binary code and used for controlling the light beam properties, for instance for deviating the light beam into the same direction as object moves, towards the southwest direction.

Example 2

In order to be able to determine the displacement of the object in the z-direction an additional transceiver is included. Determination of the displacement in the z-direction can be used for additional menu control. In this example one transmitter and three receivers are used, in a configuration as in FIG. 12. The basic principle is the same as in example 1. Time-of-flight measurements are performed on three sensors now instead of two: one transceiver and two receivers.

Distance calculation can be performed from the transmitter to the object (hand) and from the object to the three receivers by the following equations:

$$v_{air} \cdot (TOF_{T1,R1})_{t=t0} = \sqrt{(x_1 - x_0)^2 + (y_1 - y_0)^2 + (z_1 - z_0)^2} + \sqrt{(x_0 - x_1)^2 + (y_0 - y_1)^2 + (z_0 - z_1)^2}$$

$$v_{air} \cdot (TOF_{T1,R2})_{t=t0} = \sqrt{(x_1 - x_0)^2 + (y_1 - y_0)^2 + (z_1 - z_0)^2} + \sqrt{(x_0 - x_2)^2 + (y_0 - y_2)^2 + (z_0 - z_2)^2}$$

$$v_{air} \cdot (TOF_{T1,R3})_{t=t0} = \sqrt{(x_1 - x_0)^2 + (y_1 - y_0)^2 + (z_1 - z_0)^2} + \sqrt{(x_0 - x_3)^2 + (y_0 - y_3)^2 + (z_0 - z_3)^2}$$

These are 3 equations with 3 unknowns. The calculation result is: $(x_0)_{t=t0}$, $(y_0)_{t=t0}$, $(z_0)_{t=t0}$. This is the initial position of the object.

These measurements and calculations are repeated at t=$t_1$ for detecting movement distance and direction of the object, which will result in $(x_0)_{t=t1}$, $(y_0)_{t=t1}$, $(z_0)_{t=t1}$, etcetera.

Movement direction is calculated as follows:

$$\Delta x = (x_0)_{t=t0} - (x_0)_{t=t1}$$

$$\Delta y = (y_0)_{t=t0} - (y_0)_{t=t1}$$

$$\Delta z = (z_0)_{t=t0} - (z_0)_{t=t1}$$

If $\Delta x$ is positive then the object moves in the left direction, if $\Delta y$ is positive then the object moves in pull direction and if $\Delta z$ is positive then the object moves in a downwards direction.

Thus the object moves towards the southwest—downwards direction (in the XYZ-space). This position will be translated into a binary code and used for light beam properties control, for instance in this case for deviating the light beam into the same direction as the object, towards the southwest direction. Another example of the use of this position information: the movement in the XY-directions controls the direction of the light beam deviation and movement in the Z-direction controls the magnitude of the light beam deviation.

Example 3

In this example a system with three transceivers is described, in a configuration as in FIG. 12. This provides the possibility to measure the object position three times from different transmitter positions.

First at t=$t_0$ transmitter T1 will send an acoustic signal to the object. The signal will be reflected at the object and will be received by the three receivers (R1, R2, R3).

$$v_{air} \cdot (TOF_{T1,R1})_{t=t0} = \sqrt{(x_1 - x_0)^2 + (y_1 - y_0)^2 + (z_1 - z_0)^2} + \sqrt{(x_0 - x_1)^2 + (y_0 - y_1)^2 + (z_0 - z_1)^2}$$

$$v_{air} \cdot (TOF_{T1,R2})_{t=t0} = \sqrt{(x_1 - x_0)^2 + (y_1 - y_0)^2 + (z_1 - z_0)^2} + \sqrt{(x_0 - x_2)^2 + (y_0 - y_2)^2 + (z_0 - z_2)^2}$$

$$v_{air} \cdot (TOF_{T1,R3})_{t=t0} = \sqrt{(x_1 - x_0)^2 + (y_1 - y_0)^2 + (z_1 - z_0)^2} + \sqrt{(x_0 - x_3)^2 + (y_0 - y_3)^2 + (z_0 - z_3)^2}$$

These are 3 equations with 3 unknowns. The calculation result is $[(x_0)_{t=t0}]_{T1}$, $[(y_0)_{t=t0}]_{T1}$, $[(z_0)_{t=t0}]_{T1}$.

At t=$t_1$ transmitter T2 will send an acoustic signal to the object. The signal will be reflected at the object and will be received by the three receivers.

$$v_{air} \cdot (TOF_{T2,R1})_{t=t1} = \frac{\sqrt{(x_2 - x_0)^2 + (y_2 - y_0)^2 + (z_2 - z_0)^2} +}{\sqrt{(x_0 - x_1)^2 + (y_0 - y_1)^2 + (z_0 - z_1)^2}}$$

$$v_{air} \cdot (TOF_{T2,R2})_{t=t1} = \frac{\sqrt{(x_2 - x_0)^2 + (y_2 - y_0)^2 + (z_2 - z_0)^2} +}{\sqrt{(x_0 - x_2)^2 + (y_0 - y_2)^2 + (z_0 - z_2)^2}}$$

$$v_{air} \cdot (TOF_{T2,R3})_{t=t1} = \frac{\sqrt{(x_2 - x_0)^2 + (y_2 - y_0)^2 + (z_2 - z_0)^2} +}{\sqrt{(x_0 - x_3)^2 + (y_0 - y_3)^2 + (z_0 - z_3)^2}}$$

These are 3 equations with 3 unknowns. The calculation result is $[(x_0)_{t=t1}]_{T2}$, $[(y_0)_{t=t1}]_{T2}$, $[(z_0)_{t=t1}]_{T2}$.

At $t=t_2$ transmitter T3 will send an acoustic signal to the object. The signal will be reflected at the object and will be received by the three receivers.

$$v_{air} \cdot (TOF_{T3,R1})_{t=t2} = \frac{\sqrt{(x_3 - x_0)^2 + (y_3 - y_0)^2 + (z_3 - z_0)^2} +}{\sqrt{(x_0 - x_1)^2 + (y_0 - y_1)^2 + (z_0 - z_1)^2}}$$

$$v_{air} \cdot (TOF_{T3,R2})_{t=t2} = \frac{\sqrt{(x_3 - x_0)^2 + (y_3 - y_0)^2 + (z_3 - z_0)^2} +}{\sqrt{(x_0 - x_2)^2 + (y_0 - y_2)^2 + (z_0 - z_2)^2}}$$

$$v_{air} \cdot (TOF_{T3,R3})_{t=t2} = \frac{\sqrt{(x_3 - x_0)^2 + (y_3 - y_0)^2 + (z_3 - z_0)^2} +}{\sqrt{(x_0 - x_3)^2 + (y_0 - y_3)^2 + (z_0 - z_3)^2}}$$

These are 3 equations with 3 unknowns. The calculation result is $[(x_0)_{t=t2}]_{T3}$, $[(y_0)_{t=t2}]_{T3}$, $[(z_0)_{t=t2}]_{T3}$.

To have a more reliable position of the object an average of the three measurements at $t=t_0$, $t=t_1$ and $t=t_2$ is calculated. This is possible because the sample frequency for object localization is much higher than the object movement speed.

$$(x_0)_{ta} = \frac{[(x_0)_{t=t0}]_{T1} + [(x_0)_{t=t1}]_{T2} + [(x_0)_{t=t2}]_{T3}}{3}$$

$$(y_0)_{ta} = \frac{[(y_0)_{t=t0}]_{T1} + [(y_0)_{t=t1}]_{T2} + [(y_0)_{t=t2}]_{T3}}{3}$$

$$(z_0)_{ta} = \frac{[(z_0)_{t=t0}]_{T1} + [(z_0)_{t=t1}]_{T2} + [(z_0)_{t=t2}]_{T3}}{3}$$

This position is the initial position of the object.

These measurements and calculations will be repeated at $t_b$ ($t_3$, $t_4$, $t_5$) for detecting movement and movement direction of the object, which will result in $(x_0)_{tb}$, $(y_0)_{tb}$, $(z_0)_{tb}$.

Movement direction will be calculated as follows:

$$\Delta x = (x_0)_{ta} - (x_0)_{tb}$$

$$\Delta y = (y_0)_{ta} - (y_0)_{tb}$$

$$\Delta z = (z_0)_{ta} - (z_0)_{tb}$$

If $\Delta x$ is positive then the object moves in the left direction, if $\Delta y$ is positive then the object moves in pull direction and if $\Delta z$ is positive the object moves in a downwards direction.

Thus the object moves towards southwest—downwards direction (in the XYZ-space). This position will be translated into a binary code and used for light control purposes, for instance it will deviate the light beam into the same direction as the object moves, in this case towards southwest direction, and at the same time for instance the light intensity will be decreased. Another example of the use of this position information: the movement in the XY-directions controls the direction of the light beam deviation and movement in the Z-direction controls the magnitude of the light beam deviation.

With reference to FIGS. 21-25 a lamp 1 is described which is capable of continuous focus control (FIG. 21) and deflection (FIGS. 21B and 21C) of a light beam in a wide range as well as in a small region, without moving any physical parts of the lamp 1. This lamp is preferably combined with the XY-plane gesture control system as described above for changing the direction or focus of the light beam.

Figure 22:
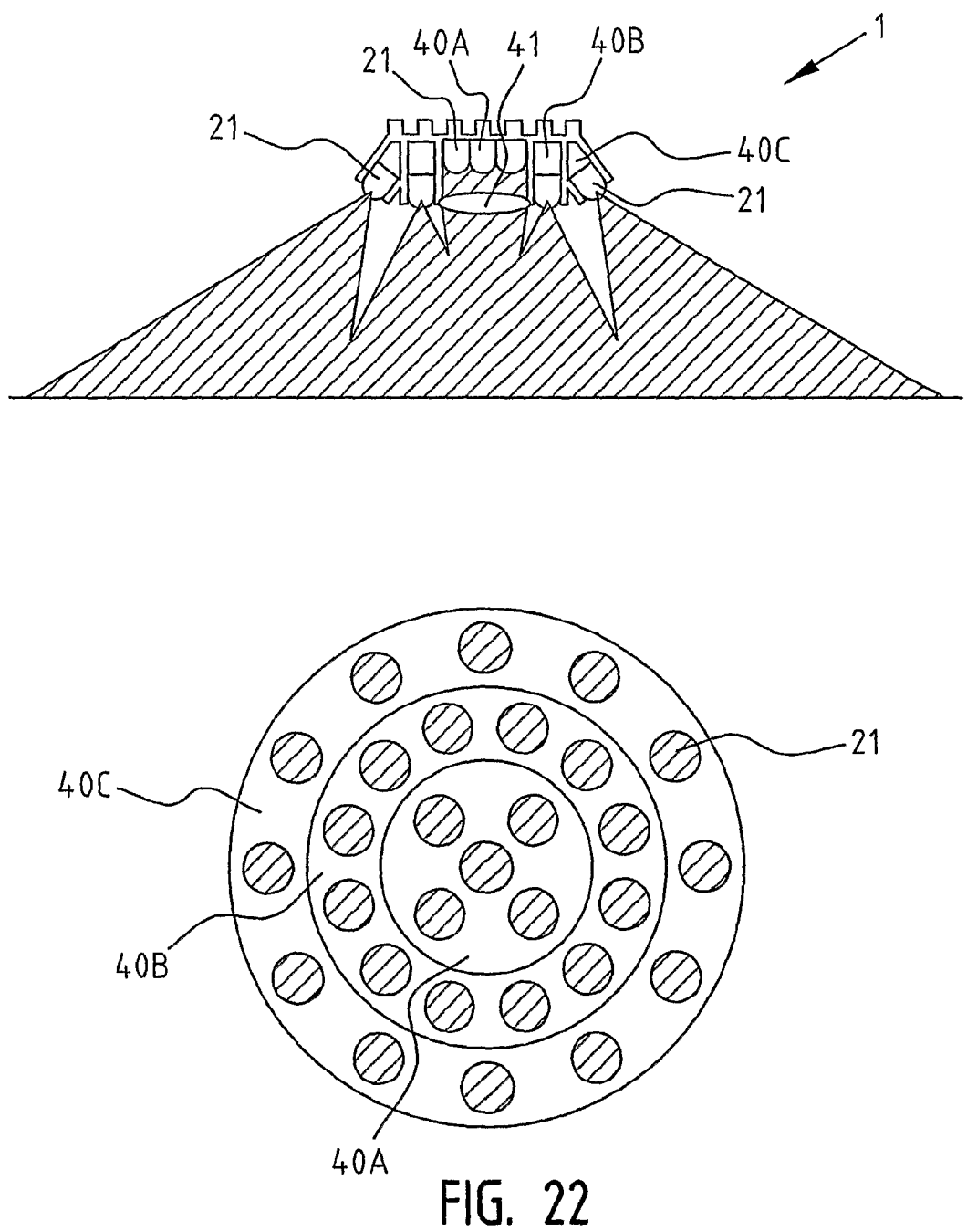
FIG. 22 shows a schematic cross section and a bottom view of a lamp.

According to FIG. 22 the lamp 1 is divided into three separated ring shaped parts 40A, 40B, 40C, each comprising an array of LEDs 21. Said LEDs may be multi-coloured, so that the lamp can show many colours of choice. Although the figures show a circle shape of the arrays, other shapes like a rectangular shape are also possible. The central part 40A of the lamp comprises a plastic lens 41 in front of the LEDs 21 for focussing the central light beam. An intermediate part 40B comprises a ring of LEDs without a lens. The LEDs in the central and intermediate parts 40A/B are arranged such that their axes of their light beams are parallel with the lamp axis. In the third part 40C the LEDs 21 are mounted at a angle with the lamp axis, which angle is between 0 and 90 degrees, for instance 40 degrees. The LEDs are mounted such, that at a predefined minimum use distance from the lamp (for instance 1 m) away, the light beams of each LED overlaps with its neighbour's, such that a continuously lighted area is obtained.

The LEDs are mounted in a metal housing having walls separating the three groups of LEDs, and which performs a heatsink function for cooling purposes.

Figure 23:
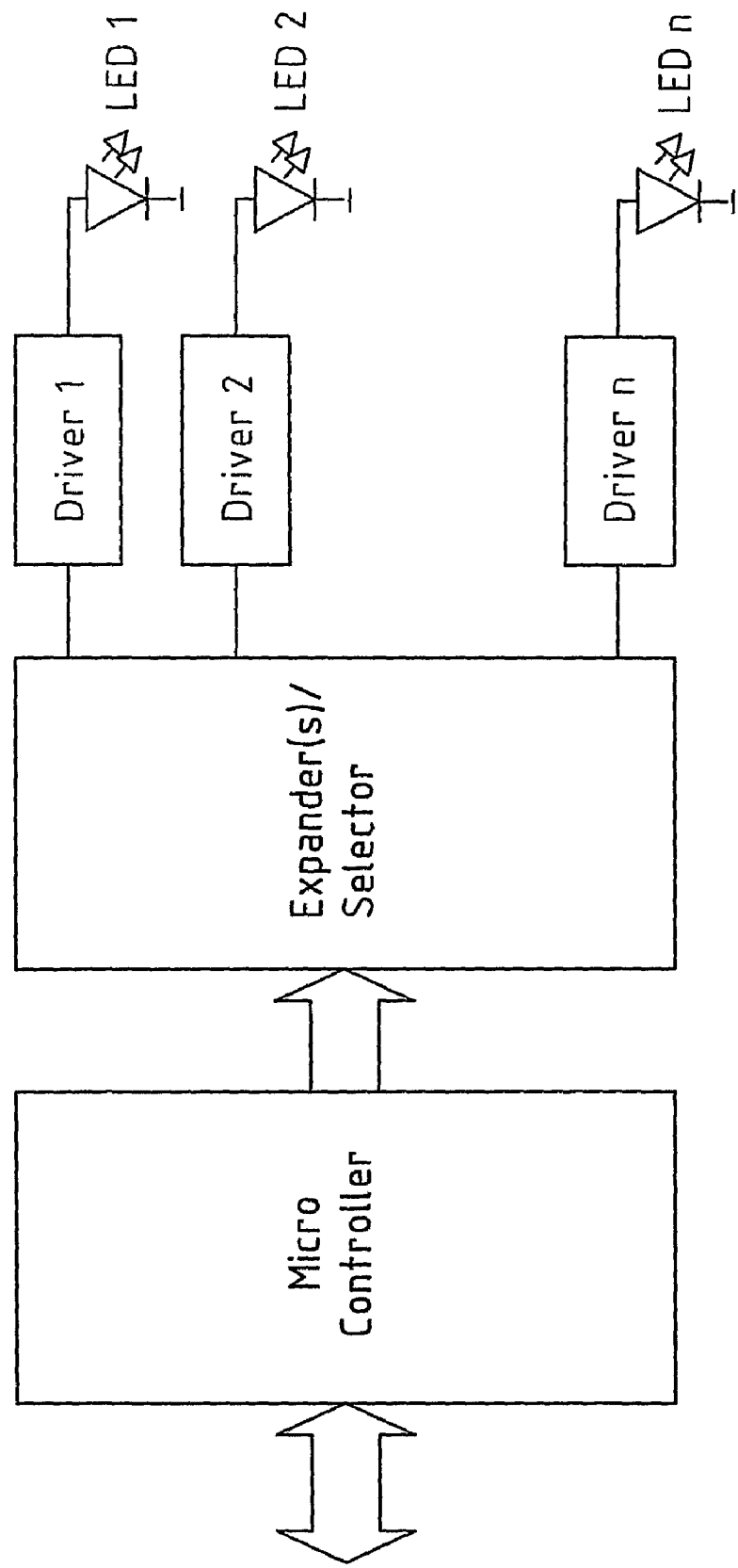
FIG. 23 shows a schematic arrangement of the lamp driver for the lamp of FIG. 22.

With reference to FIG. 23 a gesture light control system as described above (or alternatively an ordinary Remote Control) sends light beam position or focus instructions to a micro-controller 40. The micro-controller 41 translates this information into instructions as to which LEDs 21 have to be selected and as to the intensity of each of the LEDs 21. An expander/selector 42 is used for selecting the large amount of drivers 43 and the LEDs 21 connected thereto.

For a point light source the relationship between the perceived brightness B and the measured illuminance E is:

$$B = k\sqrt{E}$$

which is a non-linear behaviour that has to be compensated. If the average perceived brightness is to be kept constant during control of the light beam than the average illumination E has to be constant. Therefore the total luminous flux incident on a surface per unit area is kept constant during control of the light beam.

Figure 24A:
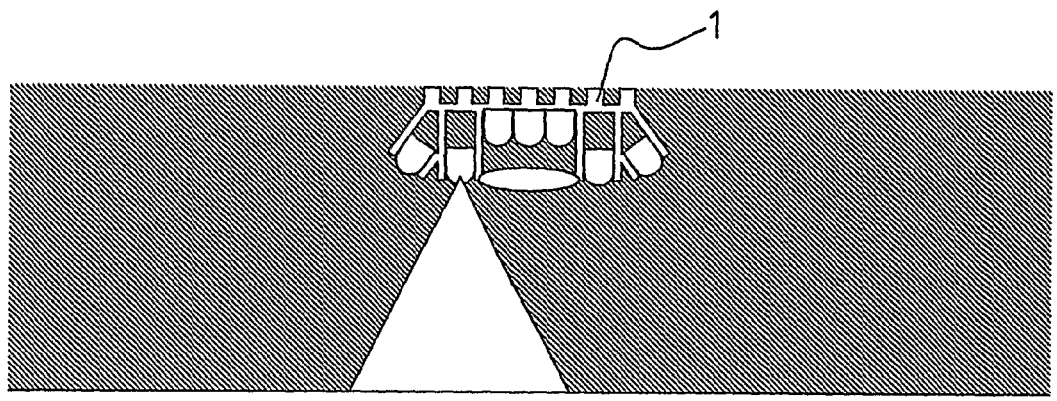
FIGS. 24A-24G schematically shows the beam deviation process of the lamp of FIG. 22.
Figure 24A:
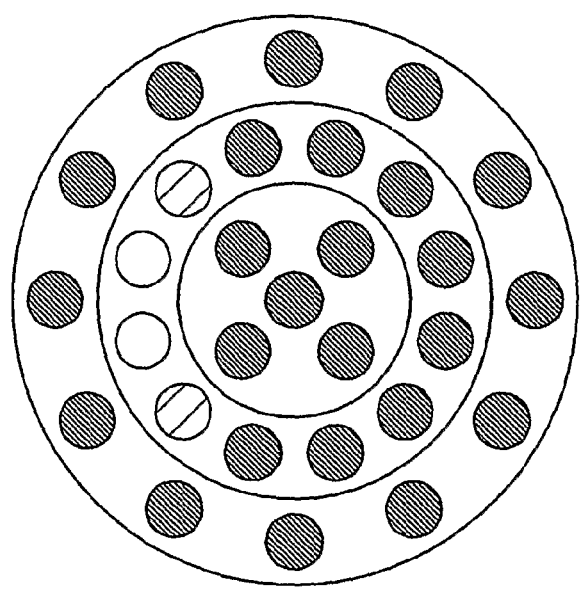
Figure 24B:
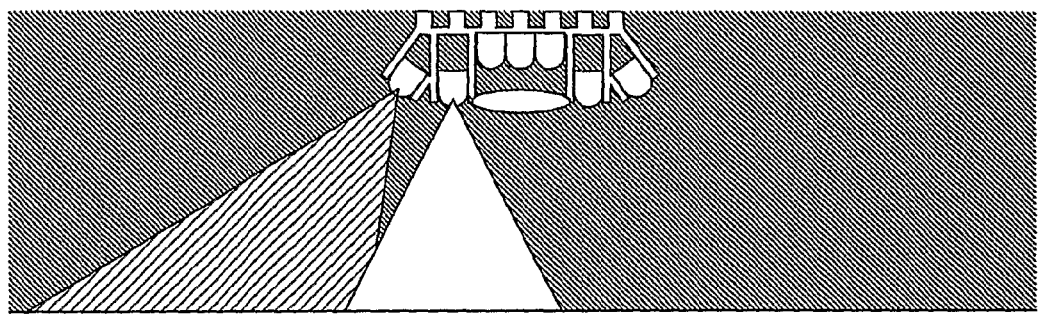
Figure 24B:
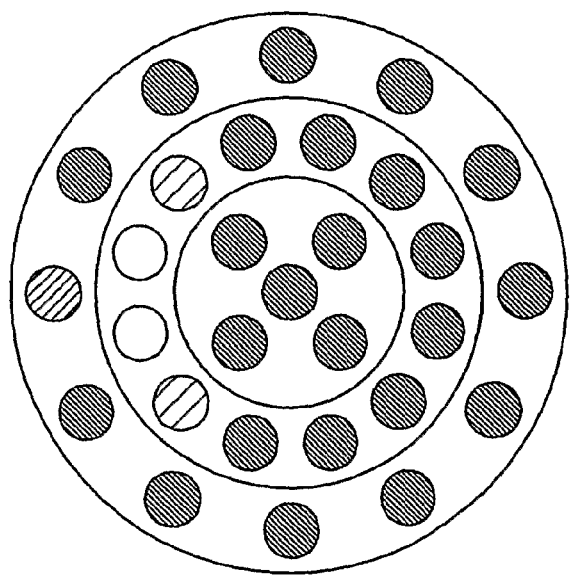
Figure 24C:
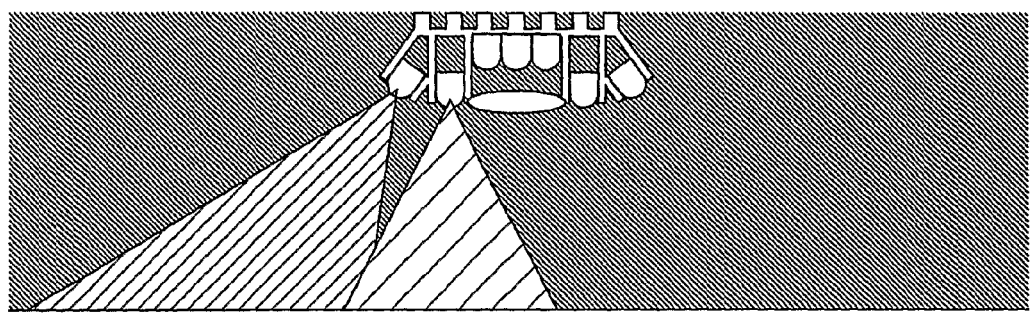
Figure 24C:
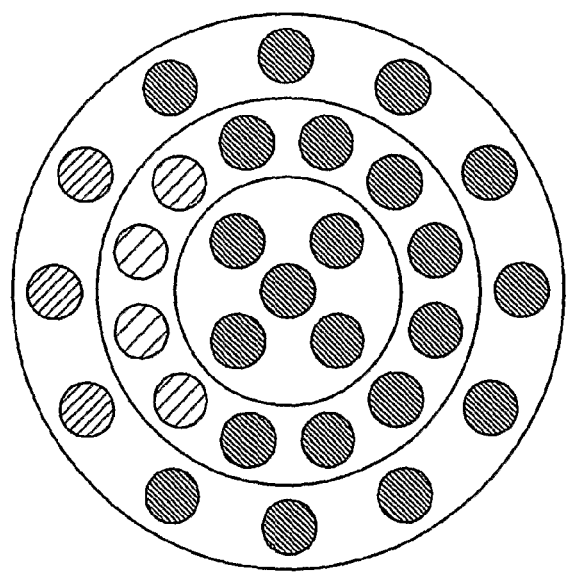
Figure 24D:
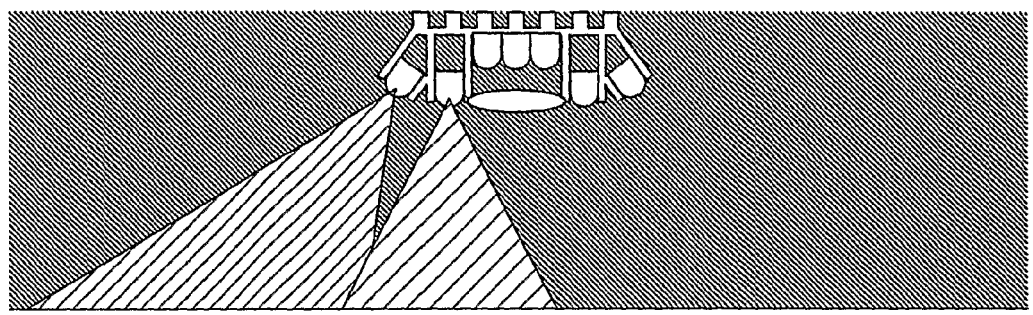
Figure 24D:
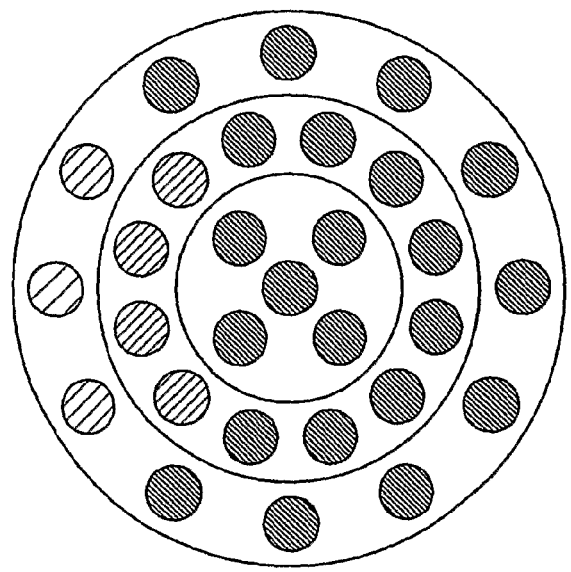
Figure 24E:
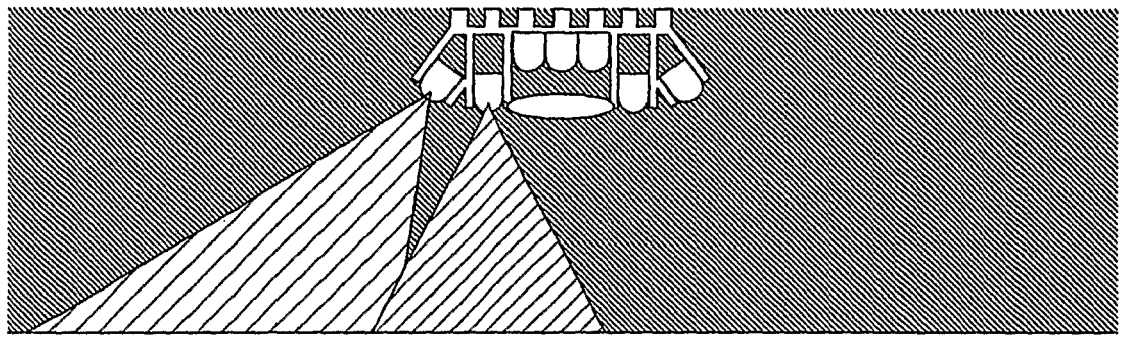
Figure 24E:
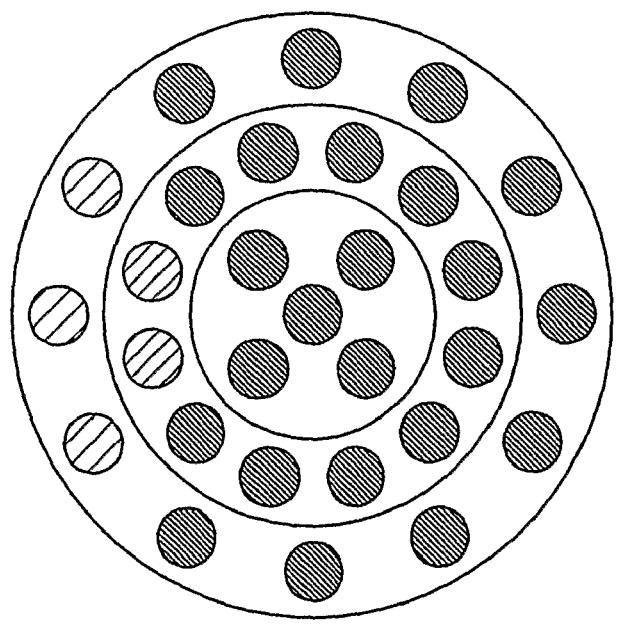
Figure 24F:
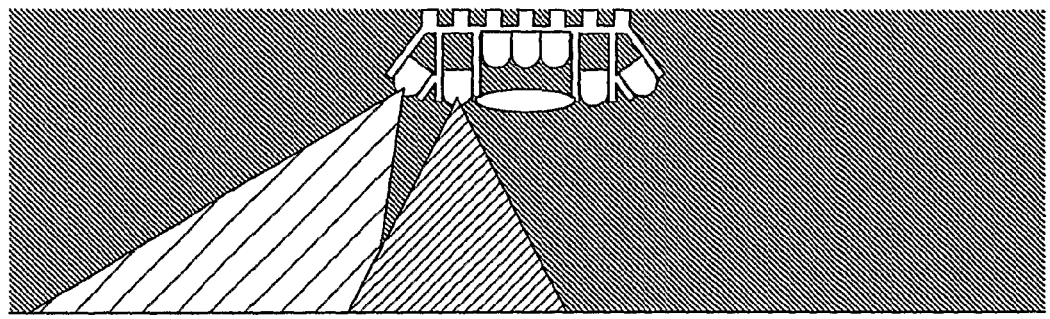
Figure 24F:
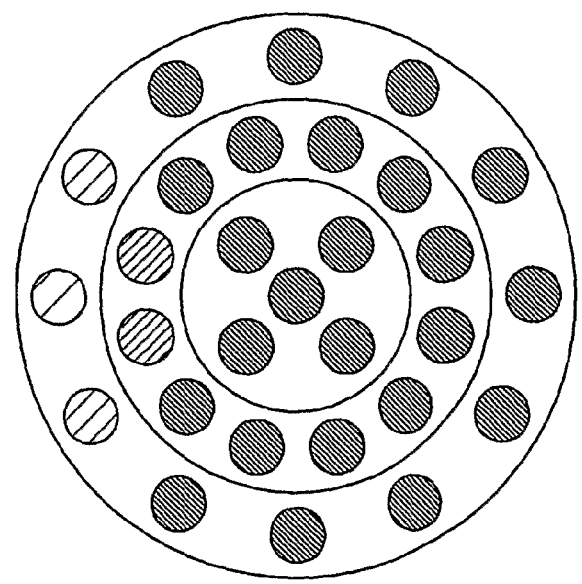
Figure 24G:
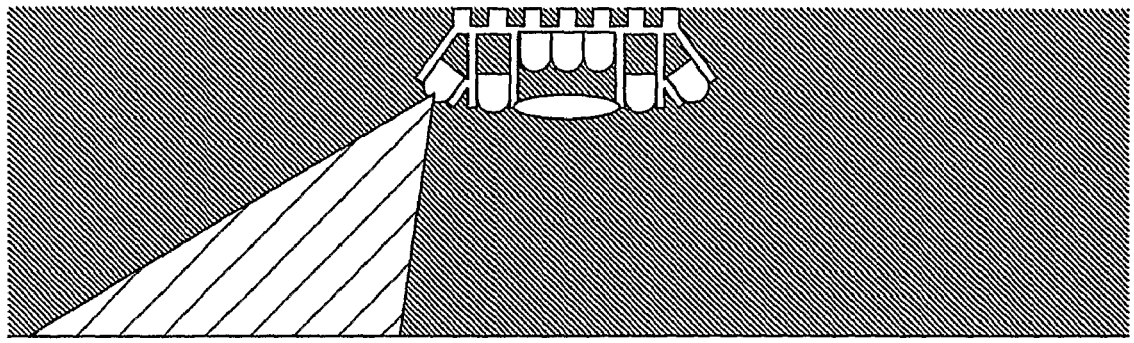
Figure 24G:
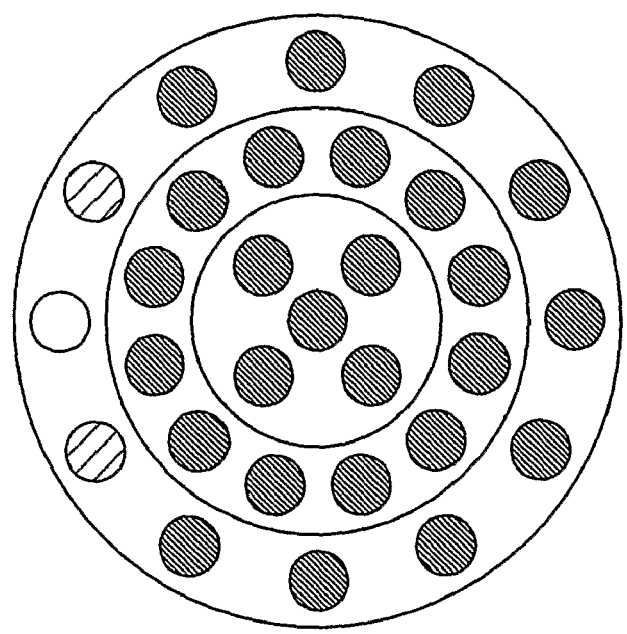

FIGS. 24A-24G schematically shows how the direction of the combined light beam in the lamp of FIG. 22 is smoothly changed from a downward direction in FIG. 24A to a laterally slanting direction in FIG. 24G (lighter hatched areas represent lighter areas/LEDs, more densely hatched areas represent darker areas/LEDs). For carrying out this control instruction the micro-controller in the lamp is arranged to gradually change the brightness of individual LEDs such that the impression of said smooth change in direction of the combined light beam is obtained.

Figure 25A:
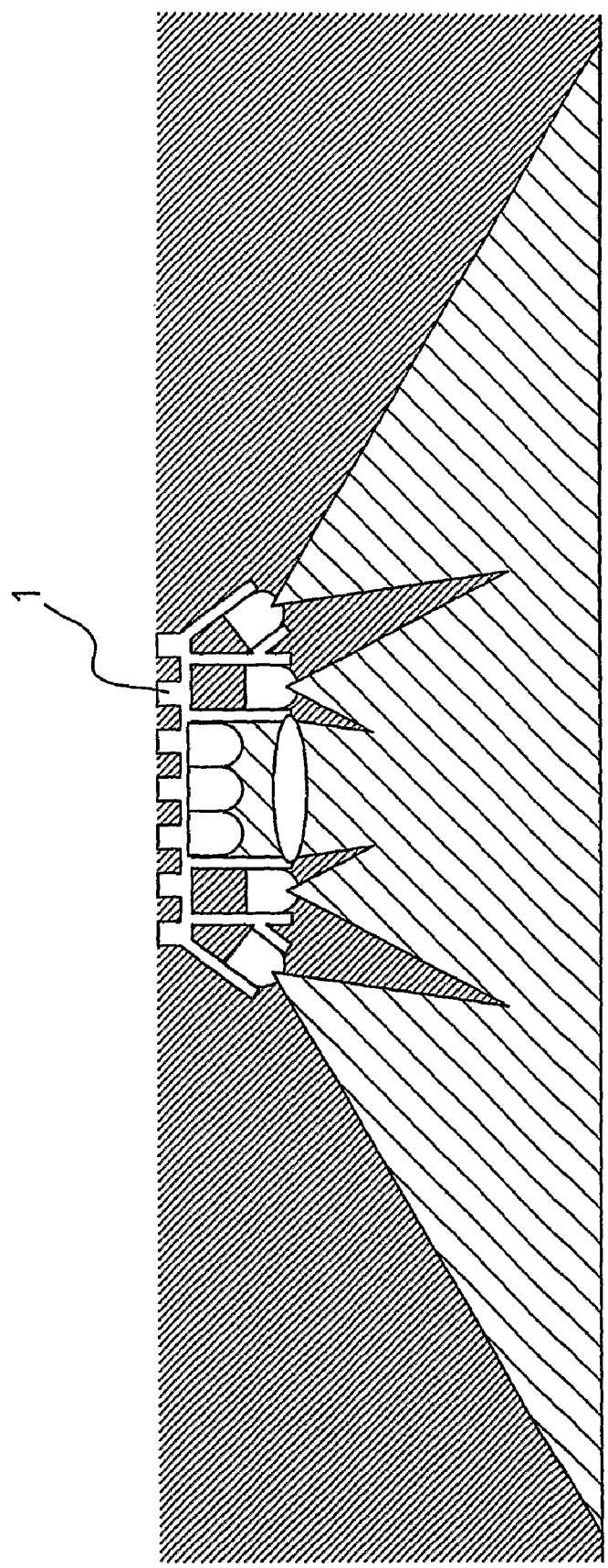
FIGS. 25A-25E schematically shows the beam focussing process of the lamp of FIG. 22.
Figure 25B:
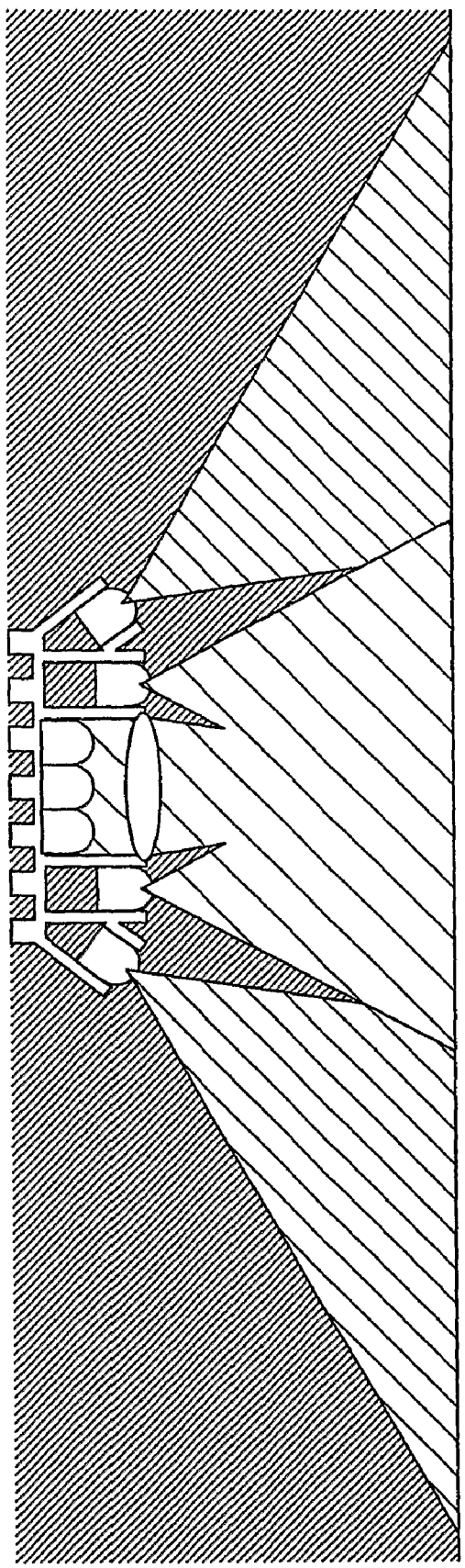
Figure 25C:
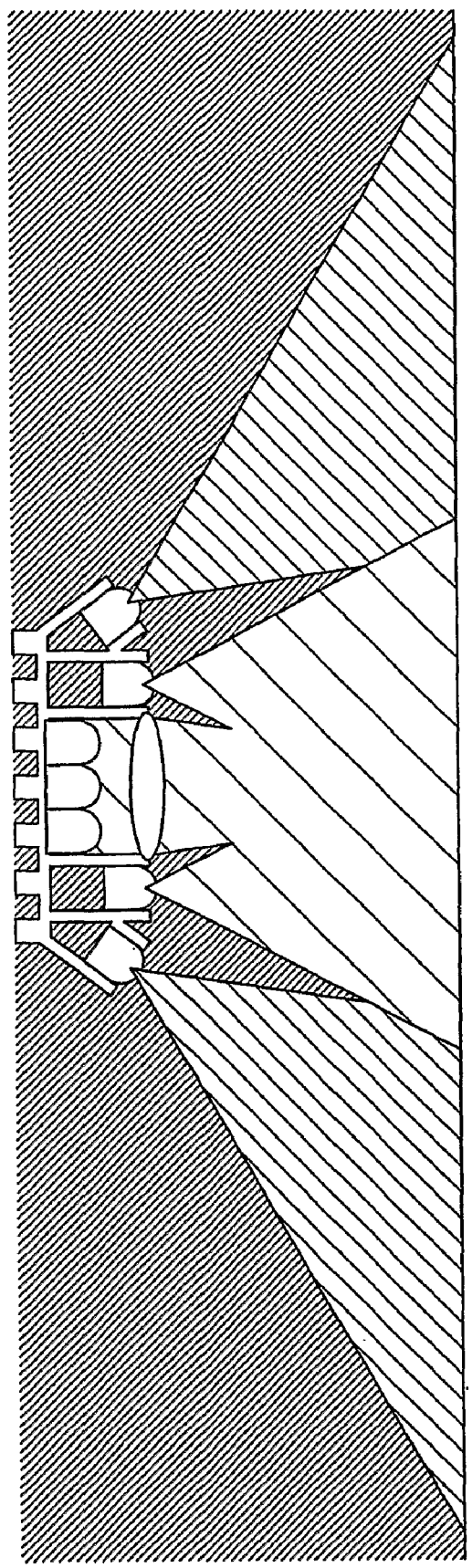
Figure 25D:
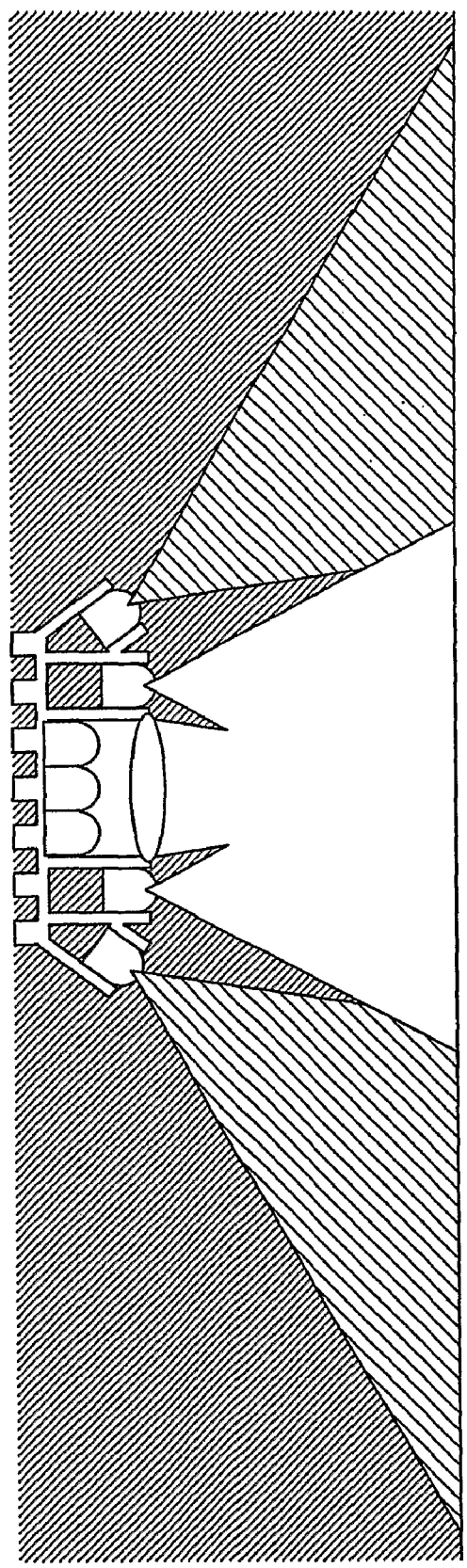
Figure 25E:
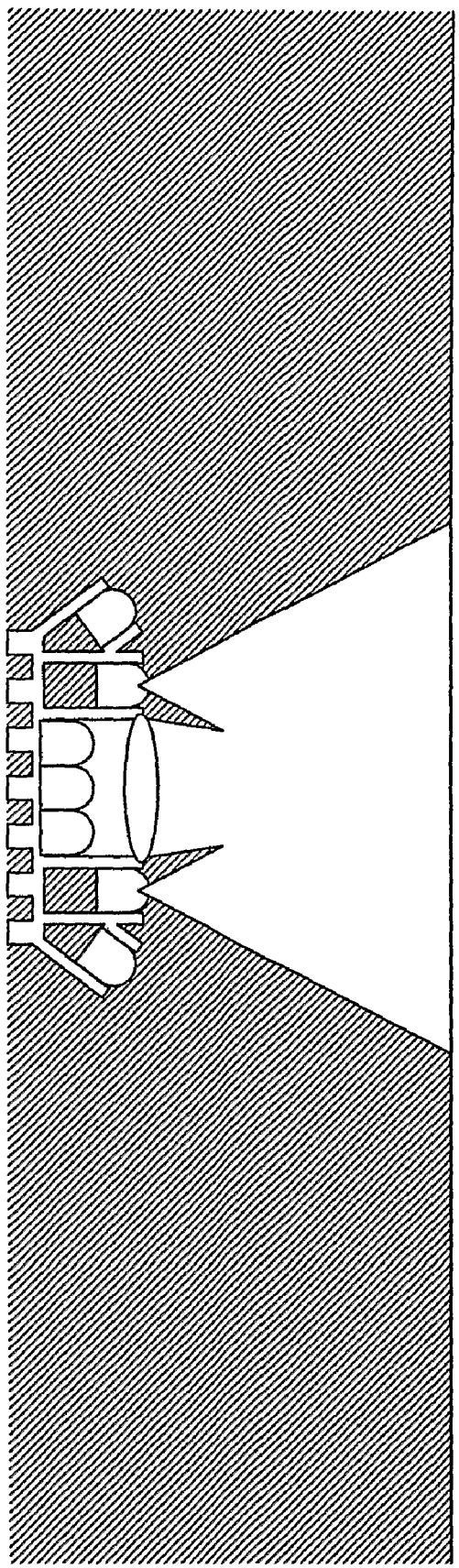

FIGS. 25A-25E schematically shows how the angle of the combined light beam in the lamp of FIG. 22 is smoothly changed from a broad beam having a large angle in FIG. 25A to a focussed beam having a small angle in FIG. 24E. For carrying out this control instruction the micro-controller in the lamp is arranged to gradually change the brightness of individual LEDs such that the impression of said smooth change in angle of the combined light beam is obtained.

Although the invention is described herein by way of preferred embodiments as example, the man skilled in the art will appreciate that many modifications and variations are possible within the scope of the invention.

The invention claimed is:

1. A lighting system comprising
a plurality of light units, wherein said light units are arranged in an array, wherein light beams of each pair of adjacent light units overlap each other,
an ultrasonic transmitter arranged to transmit ultrasonic signals,
an ultrasonic receiver arranged to receive reflected ultrasonic signals,
a light control device which is arranged to adjust the intensity of each one of said plurality of light units individually, and
a processing device arranged to derive a time-of-flight signal representing the time differences between said transmitted and received ultrasonic signals and to send control signals to said light control device in dependence of said time-of-flight signal for adjusting the light intensity of said individual light units,
wherein said light control device is further arranged to maintain the total combined luminous flux emitted from said plurality of light units on a predefined imaginary flat surface substantially equal when adjusting the intensity of the individual light units.

2. The lighting system of claim 1, wherein said light control device is arranged to adjust the intensity of the individual light units by dimming and/or brightening such that a diameter of the combined light beam of the plurality of light units that are switched on increases or decreases smoothly.

3. The lighting system of claim 1, wherein said light control device is arranged to adjust the intensity of the individual light units by dimming and brightening such that a direction of the combined light beam of the plurality of light units that are switched on moves smoothly from a first direction to a second direction.

4. The lighting system of claim 1, wherein said plurality of light units are arranged in at least two groups forming concentric polygons or circles, wherein light beams of the inner group of the at least two groups are directed substantially parallel to each other, wherein light beams of the light units in the outer group of the at least two groups diverge from the light beams of the light units in the inner group.

5. The lighting system of claim 4, wherein the lighting system comprises a lens extending in the light beam of the light units of said inner group for focusing said light beam.

6. The lighting system of claim 4, wherein the lighting system comprises at least one middle group of light units extending in a concentric polygon or circle between the inner and outer groups.

7. The lighting system of claim 6, wherein the light beams of said middle group are directed substantially parallel to the light beams of said inner group.

8. The lighting system of claim 1, wherein said plurality of light units are LEDs.

9. The lighting system of claim 1, wherein said plurality of light units are contained in one lamp housing.

10. The lighting system of claim 9, wherein said lamp housing comprises a standard lamp fitting.

* * * * *